US012062620B2

(12) United States Patent
Zeng et al.

(10) Patent No.: US 12,062,620 B2
(45) Date of Patent: Aug. 13, 2024

(54) ARRAY SUBSTRATE, LIGHT-EMITTING SUBSTRATE AND DISPLAY DEVICE

(71) Applicants: Hefei Xinsheng Optoelectronics Technology Co., Ltd., Hefei (CN); BOE TECHNOLOGY GROUP CO., LTD., Beijing (CN)

(72) Inventors: Qin Zeng, Beijing (CN); Zouming Xu, Beijing (CN); Chunjian Liu, Beijing (CN); Jian Tian, Beijing (CN); Xintao Wu, Beijing (CN); Jie Lei, Beijing (CN); Jie Wang, Beijing (CN); Xiaodong Xie, Beijing (CN); Min He, Beijing (CN); Xinxiu Zhang, Beijing (CN); Xue Zhao, Beijing (CN); Huayu Sang, Beijing (CN); Wenjie Xu, Beijing (CN)

(73) Assignees: Hefei Xinsheng Optoelectronics Technology Co., Ltd., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 443 days.

(21) Appl. No.: 17/611,801

(22) PCT Filed: Dec. 8, 2020

(86) PCT No.: PCT/CN2020/134686
§ 371 (c)(1),
(2) Date: Nov. 16, 2021

(87) PCT Pub. No.: WO2022/120605
PCT Pub. Date: Jun. 16, 2022

(65) Prior Publication Data
US 2022/0359402 A1    Nov. 10, 2022

(51) Int. Cl.
*H01L 25/16* (2023.01)
*H01L 23/538* (2006.01)
(Continued)

(52) U.S. Cl.
CPC ........ *H01L 23/5386* (2013.01); *H01L 25/167* (2013.01); *H01L 33/62* (2013.01);
(Continued)

(58) Field of Classification Search
None
See application file for complete search history.

(56) References Cited

U.S. PATENT DOCUMENTS

| 6,531,815 B1 * | 3/2003 | Okuyama | ............ | H10K 59/131 |
| | | | | 313/506 |
| 10,395,589 B1 * | 8/2019 | Vahid Far | ............ | G09G 3/3208 |

(Continued)

FOREIGN PATENT DOCUMENTS

| CN | 105047609 A | 11/2015 |
| CN | 107742636 A | 2/2018 |

(Continued)

OTHER PUBLICATIONS

Written Opinion for PCT Patent Application No. PCT/CN2020/134686 mailed Aug. 26, 2021.

*Primary Examiner* — Bilkis Jahan
(74) *Attorney, Agent, or Firm* — Perilla Knox & Hildebrandt LLP; Kenneth A. Knox

(57) ABSTRACT

An array substrate includes connecting leads, a signal channel region extending in a first direction, a first power voltage lead, and a second power voltage lead. Any one of the signal channel region includes at least two control region columns extending in the first direction, and any one of the control region columns includes a plurality of control regions arranged along the first direction. Any one of the control (Continued)

regions includes a pad connecting circuit and a first pad group for bonding a microchip, the first pad group is electrically connected to the first power voltage lead. The pad connection circuit includes a plurality of second pad groups, and is provided with a first end electrically connected to the first pad group, and a second end electrically connected to the second power voltage lead.

20 Claims, 9 Drawing Sheets

(51) Int. Cl.
    *H01L 33/62*     (2010.01)
    *H01L 23/00*     (2006.01)

(52) U.S. Cl.
    CPC .............. *H01L 24/05* (2013.01); *H01L 24/06* (2013.01); *H01L 2224/05552* (2013.01); *H01L 2224/0615* (2013.01)

(56) References Cited

U.S. PATENT DOCUMENTS

| | | | |
|---|---|---|---|
| 10,650,730 B2 | 5/2020 | Son | |
| 2014/0197433 A1* | 7/2014 | Ishizaki | .................. F21V 29/74 |
| | | | 257/91 |
| 2019/0005870 A1 | 1/2019 | Son | |
| 2021/0151650 A1* | 5/2021 | Wu | .......................... G09G 3/32 |
| 2023/0253386 A1* | 8/2023 | Lee | ....................... H01L 25/167 |
| | | | 345/214 |

FOREIGN PATENT DOCUMENTS

| | | |
|---|---|---|
| CN | 111293140 A | 6/2020 |
| CN | 111341273 A | 6/2020 |
| CN | 111477176 A | 7/2020 |
| CN | 111540764 A | 8/2020 |
| CN | 111913323 A | 11/2020 |
| EP | 3422414 A1 | 1/2019 |
| EP | 3422414 B1 | 9/2020 |

* cited by examiner

ARRAY SUBSTRATE, LIGHT-EMITTING SUBSTRATE AND DISPLAY DEVICE

CROSS-REFERENCE TO RELATED APPLICATION

This application is a national phase application under 35 U.S.C. § 371 of International Application No. PCT/CN2020/134686, filed Dec. 8, 2020, the entire contents of which are incorporated herein by reference for all purposes.

TECHNICAL FIELD

The disclosure relates to the field of display technology and, in particular, to an array substrate, a light-emitting substrate, and a display device.

BACKGROUND

As far as the actively driven Mini-LED (mini light-emitting diode) display device is concerned, addressing control is adopted, thereby enabling accurate control of light and dark positions of lamp beads in each zone, so as to effectively realize accurate local diming and, accordingly, achieve a display contrast in the order of millions.

SUMMARY

The disclosure is directed to provide an array substrate, a light-emitting substrate, and a display device, thereby improving the anti-signal-disturbance ability of the array substrate.

In order to achieve the disclosure, following technical solutions are provided.

According to an aspect of the disclosure, there is provided an array substrate, including at least one signal channel region extending in a first direction and a plurality of driving leads extending in the first direction; wherein the driving leads include a first power voltage lead and a second power voltage lead;

any one of the signal channel region includes at least two control region columns extending in the first direction, and any one of the control region columns includes a plurality of control regions arranged along the first direction;

any one of the control regions includes at least one pad connection circuit and a first pad group used for bonding a microchip, and the first pad group is electrically connected to the first power voltage lead; any one of the pad connection circuit includes a plurality of second pad groups connected through a connecting lead, a first end of the pad connection circuit is electrically connected to the first pad group, and a second end of the pad connection circuit is electrically connected to the second power voltage lead; and in the at least one signal channel region, each of first pad groups in the at least two control region columns is electrically connected to a same one of the first power voltage lead.

In some exemplary embodiments, any one of the signal channel region includes two control region columns; in any one of the signal channel region, a number of the first power voltage lead is one, and a number of the second power voltage lead is two and the two second power voltage leads are respectively located at both sides of the first power voltage lead;

in any one of the signal channel region, each of the first pad groups is electrically connected to the first power voltage lead, and the second end of each of the pad connection circuit is electrically connected to the second power voltage lead.

In some exemplary embodiments, in two adjacent signal channel regions, two adjacent second power voltage leads are electrically connected to each other.

In some exemplary embodiments, the array substrate further includes a plurality of conductive connecting parts, and the two adjacent second power voltage leads are connected through the plurality of conductive connecting parts.

In some exemplary embodiments, the driving lead further includes at least one microchip driving lead connected to the first pad group and used for driving the microchip, and in any one of the signal channel region, the microchip driving lead is located between the first power voltage lead and the second power voltage lead.

In some exemplary embodiments, any one of the first pad group includes a first input signal sub-pad used for loading a first input signal, a first power voltage sub-pad used for loading a first power voltage, and at least one output sub-pad used for loading an output signal;

in any one of the signal channel region, the microchip driving lead at least includes a first input signal lead located between the first power voltage lead and the second power voltage lead;

the first input signal sub-pad is connected to the first input signal lead directly or through the connecting lead;

the first power voltage sub-pad is connected to the first power voltage lead directly or through the connecting lead;

in any one of the control regions, the at least one pad connection circuit and the at least one output sub-pad are arranged in a one-to-one correspondence, and the first end of any one of the pad connection circuit is connected to a corresponding one of the output sub-pad through the connecting lead.

In some exemplary embodiments, in any one of the signal channel region, a number of the first input signal lead is two, and the two of first input signal leads are respectively located at both sides of the first power voltage lead.

In some exemplary embodiments, the second direction is parallel to a plane of the array substrate and perpendicular to the first direction;

in any one of the signal channel region, along the second direction, first one of the control region columns corresponds to first one of the second power voltage leads and first one of the first input signal leads, and second one of the control region columns corresponds to second one of the second power voltage leads and second one of the first input signal leads;

the second end of each of the pad connection circuits in the control region column is electrically connected to a corresponding one of the second power voltage leads through the connecting lead, and each of the first input signal sub-pads in the control region column is connected to a corresponding one of the first input signal leads through the connecting lead.

In some exemplary embodiments, in any one of the signal channel region, the microchip driving lead further includes a second input signal lead, the first pad group further includes a second input signal sub-pad; and the second input signal lead is used for loading a second input signal to at least one of the second input signal sub-pad.

In some exemplary embodiments, in any one of the signal channel region, P of the first pad groups are sequentially numbered according to a preset order; wherein, the second input signal sub-pad in the first pad group numbered 1 is connected to the second input signal lead through the connecting lead, and the output sub-pad in the first pad group numbered p is electrically connected to the second input signal sub-pad in the first pad group numbered p+1 through the connecting lead, wherein p and P are integers, and p is valued greater than 1 and less than P.

In some exemplary embodiments, in any one of the signal channel region, the second input signal lead is located between the first input signal lead and the second power voltage lead.

In some exemplary embodiments, the array substrate further includes a bonding region, and the bonding region is provided with bonding pads respectively connected to each of the driving leads; a control region farthest from the bonding region in any one of the control region columns is first one of the control regions in the control region column.

In some exemplary embodiments, the bonding region is provided with a floating bonding pad, and the floating bonding pad is connected to the output sub-pad of the first pad group numbered P in the signal channel region.

In some exemplary embodiments, the second direction is parallel to a plane of the array substrate and perpendicular to the first direction;

in any one of the signal channel region, along the second direction, the second input signal lead is located between first one of the second power voltage leads and second one of the first input signal leads; and a distance between the first one of the second power voltage leads and the second one of the first input signal leads is equal to a distance between second one of the second power voltage leads and the second one of the first input signal leads.

In some exemplary embodiments, the array substrate further includes a bonding region, and the bonding region is provided with at least one bonding pad group corresponding to the at least one signal channel region one by one; wherein any one of the bonding pad group includes a plurality of bonding pads connected in a one-to-one correspondence with the plurality of driving leads in the corresponding signal channel region.

In some exemplary embodiments, the plurality of driving leads in any one of the signal channel region are arranged in an order along a direction perpendicular to the first direction, and the plurality of bonding pads connected to the plurality of driving leads, respectively, are arranged in the same order along the same direction.

In some exemplary embodiments, any one of the bonding pad group includes a second power voltage bonding pad for connecting with the second power voltage lead;

wherein, two of the second power voltage bonding pad connected respectively by two adjacent ones of the second power voltage lead in two adjacent signal channel regions are connected to each other as a whole.

In some exemplary embodiments, the second pad group consists of a first sub-pad and a second sub-pad.

In some exemplary embodiments, any one of the pad connection circuits includes a plurality of the second pad groups connected in sequence, wherein the first sub-pad in first one of the second pad groups is electrically connected to the second power voltage lead through the connecting lead, and the second sub-pad in last one of the second pad groups is electrically connected to the first pad group through the connecting lead, and the second sub-pad in a previous one of the second pad groups is connected to the first sub-pad in a latter one of the second pad groups through the connecting lead.

In some exemplary embodiments, the array substrate includes a substrate base, a first metal wiring layer, an insulating material layer, and a second metal wiring layer that are sequentially stacked, wherein the driving leads and the bonding pad group are located on the first metal wiring layer, the connecting lead, the first pad group, and the second pad group are located on the second metal wiring layer; the second metal wiring is electrically connected to the first metal wiring layer through a via hole located in the insulating material layer.

According to a second aspect of the disclosure, there is provided a light-emitting substrate, including the array substrate as described above, and microchips bonded to each of the first pad group in a one-to-one correspondence and light-emitting elements bonded to each of the first pad group in a one-to-one correspondence.

According to a third aspect of the disclosure, there is provided a display device including the light-emitting substrate as described above.

BRIEF DESCRIPTION OF THE DRAWINGS

The above-mentioned and other features and advantages of the disclosure will become more apparent through detailed description of the exemplary embodiments with reference to the accompanying drawings.

DETAILED DESCRIPTION

Figure 1:
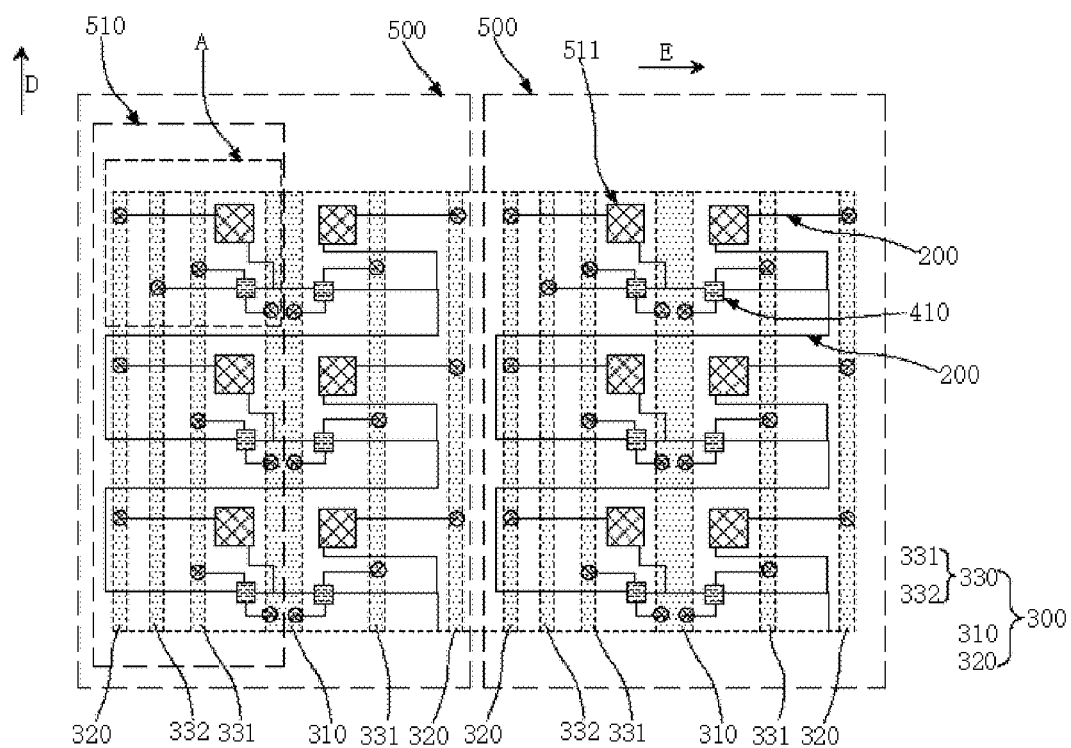
FIG. 1 is a schematic diagram illustrating the structural principle of the array substrate according to some embodiments of the disclosure.

Exemplary embodiments will now be described more fully with reference to the accompanying drawings. However, the exemplary embodiments can be implemented in various forms and should not be construed as limited to the embodiments set forth herein. Rather, these embodiments are provided so that this disclosure will be thorough and complete, and will fully convey the concept of the exemplary embodiments to those skilled in the art. The described features, structures or characteristics may be combined in one or more embodiments in any suitable manner. In the following description, many specific details are provided to give a sufficient understanding of the embodiments of the disclosure.

In the drawings, the thickness of regions and layers may be exaggerated for clarity. The same reference numerals in the drawings represent the same or similar structures, and thus their detailed descriptions will be omitted.

The described features, structures or characteristics may be combined in one or more embodiments in any suitable way. In the following description, many specific details are provided to give a sufficient understanding of the embodiments of the disclosure. However, those skilled in the art will realize that the technical solutions of the disclosure can be practiced without one or more of the specific details, or other methods, components, materials, and the like can be used. In alternative embodiments, well-known structures, materials, or operations are not shown or described in detail to avoid obscuring the main technical ideas of the disclosure.

When a structure is "above/on" another structure, it may mean that the structure is integrally formed on the other structure, or that the structure is "directly" provided on the other structures, or that the structure is "indirectly" provided on the other structure through yet another structure.

The terms "a", "a", and "the" are used to indicate presence of one or more elements/components or the like. The terms "include/comprise" and "have/has" means that, in addition to the elements/components or the like as listed, there may be additional elements/components or the like. The terms "first" and "second" are only used as markers and are not a limitation on the number of objects.

In the disclosure, when describing "overlapping" between two structures, it means that an orthographic projection of one structure on the substrate base at least partially overlaps with an orthographic projection of the other structure on the substrate base. In the disclosure, when describing "complete overlapping" between two structures, it means that the orthographic projection of one structure on the substrate base is completely located within the orthographic projection of the other structure on the substrate base.

Reference signs of main components in the drawings are explained as follows: 110 substrate base; 120 buffer layer; 130 first metal wiring layer; 131 copper seed layer; 132 copper growth layer; 140 insulating material layer; 141 first passivation layer; 142 planarization organic material layer; 150 second metal wiring layer; 160 second passivation layer; 170 insulating protection layer; 200 connecting lead; 300 driving lead; 310 first power voltage lead; 320 second power voltage lead; 330 microchip driving lead; 331 first input signal lead; 332 second input signal lead; 340 conductive connecting part; 410 first pad group; 411 first input signal sub-pad; 412 second input signal sub-pad; 413 first power voltage sub-pad; 414 output sub-pad; 420 second pad group; 421 first sub-pad; 422 second sub-pad; 430 bonding pad; 4301 bonding electrode; 431 first power voltage bonding pad; 432 second power voltage bonding pad; 433 first input signal bonding pad; 434 second input signal bonding pad; 435 floating bonding pad; 436 dummy electrode; 440 fan-out lead; 441 first power voltage fan-out lead; 442 second power voltage fan-out lead; 443 first input signal fan-out lead; 444 second input signal fan-out lead; 445 floating fan-out lead; 500 signal channel region; 510 control region column; 511 pad connection circuit; 600 microchip; 610 first input signal pin; 620 second input signal pin; 630 first power voltage pin; 640 output pin; 700 light-emitting element; 801 light-emitting circuit; A control region; B bonding region; D first direction; and E second direction.

The disclosure provides an array substrate. Referring to FIG. 1, the array substrate includes a plurality of connecting leads 200, at least one signal channel region 500 extending in a first direction D, and a plurality of driving leads 300 extending in the first direction D. The driving lead 300 includes at least a first power voltage lead 310 and a second power voltage lead 320.

Any one signal channel region 500 includes at least two control region columns 510 extending in the first direction D, and any one control region column 510 includes a plurality of control regions A arranged along the first direction D.

Figure 2:
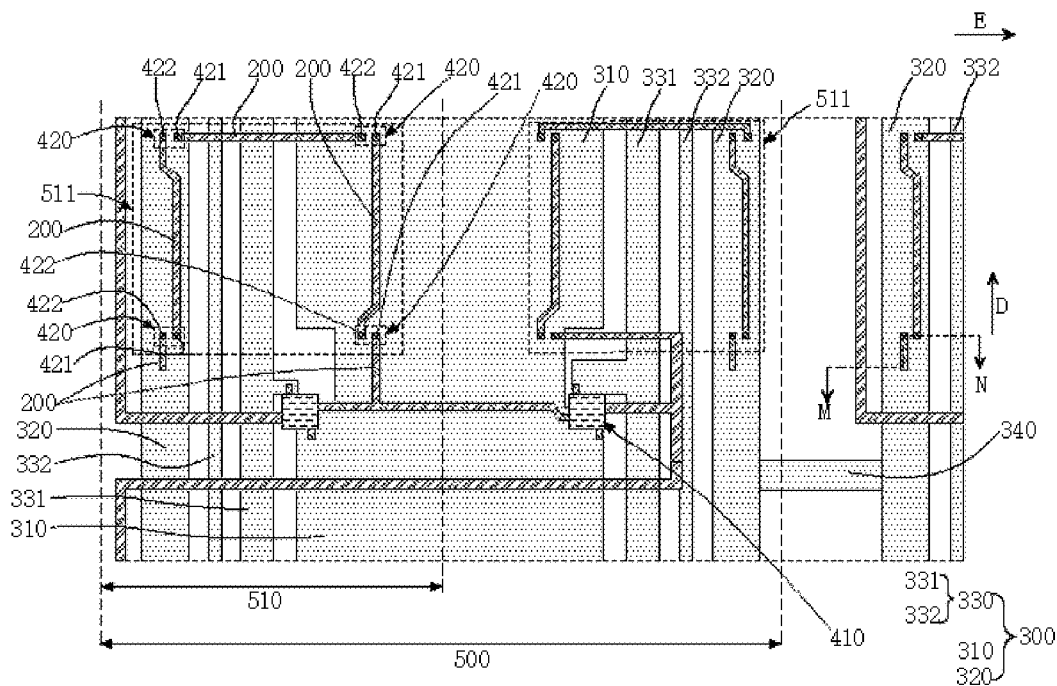
FIG. 2 is a schematic diagram illustrating a partial structure of the first metal wiring layer and the second metal wiring layer in the array substrate according to some embodiments of the disclosure.
Figure 4:
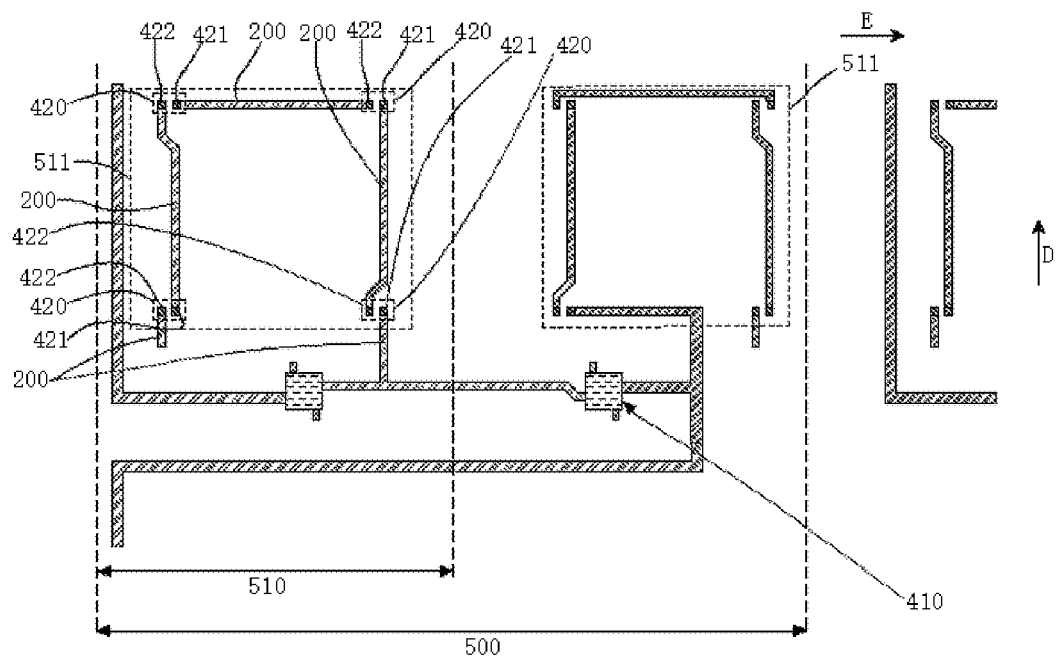
FIG. 4 is a schematic diagram illustrating a structure of the second metal wiring layer in FIG. 2.

Any control region A includes at least one pad connection circuit 511 and a first pad group 410 for bonding a microchip 600, and the first pad group 410 is electrically connected to the first power voltage lead 310. Referring to FIG. 2 and FIG. 4, any one of the pad connection circuits 511 includes a plurality of second pad groups 420 connected through connecting leads 200, and a first end of the pad connection circuit 511 is electrically connected to the first pad group 410, and a second end of the pad connection circuit 511 is electrically connected to the second power voltage lead 320.

In some embodiments, in at least one signal channel region 500, each first pad group 410 in the at least two control region columns 510 is electrically connected to the same first power voltage lead 310.

In the array substrate provided by the disclosure, at least two control region columns 510 share the same first power voltage lead 310. Compared with the design in which each control region column 510 is provided with a respective first power voltage lead 310, the first power voltage lead 310 according to the disclosure can be provided with a larger width to reduce impedance and reduce fluctuation of a power voltage VG loaded by the first power voltage lead 310, thereby improving stability of the loaded first power voltage VG, and improving anti-disturbance ability of the array substrate and facilitating debugging of the array substrate. In some embodiments, any one signal channel region 500 includes 2M control region columns 510 extending in the first direction D, and any one control region column 510 includes a plurality of control regions A arranged along the first direction D, where M is a positive integer greater than or equal to 1. In one signal channel region 500, at least two adjacent control region columns 510 can share the same first power voltage lead 310, so that the number of first power voltage leads 310 in a signal channel region is less than 2M, a width of the first power voltage lead 310 can be increased, and the anti-disturbance ability of the array substrate can be improved.

In some embodiments, any one signal channel region 500 includes 2M control region columns 510 extending in the first direction D, and any one control region column 510 includes a plurality of control regions A arranged along the first direction D, where M is a positive integer greater than or equal to 1. In one signal channel region 500, 2 m adjacent control region columns 510 can share the same first power voltage lead 310, where m is a positive integer greater than 1. The first power voltage lead 310 may be located in a region between two control region columns 510 in the middle of the 2 m control region columns 510. In this way, the number of the first power voltage leads 310 in the signal channel region is less than 2M, the width of the first power voltage lead 310 can be increased, and the anti-disturbance ability of the array substrate can be improved.

In some embodiments, any one signal channel region 500 includes 2M control region columns 510 extending in the first direction D, and any one control region column 510 includes a plurality of control regions A arranged along the first direction D, where M is a positive integer greater than or equal to 1. The 2M control region columns 510 in the signal channel region can be divided into M groups, with each group including two adjacent control region columns 510, and different groups do not share the same control region column 510. In other words, 2M control region columns 510 may be sequentially divided into M groups along the second direction E, with each group including two control region columns 510. In some embodiments, the second direction E is a direction perpendicular to the first direction D in the plane where the array substrate is located. In some embodiments, each group can share the same first power voltage lead 310, so that only M first power voltage leads 310 need to be provided in one signal channel region 500, thereby increasing the width of the first power voltage lead 310 and improving the anti-disturbance ability of the array substrate.

In some embodiments, any one signal channel region 500 includes 2M+1 control region columns 510 extending in the first direction D, and any one control region column 510 includes a plurality of control regions A arranged along the first direction D, where M is a positive integer greater than 1. In one signal channel region 500, at least two adjacent control region columns 510 can share the same first power voltage lead 310, so that the number of first power voltage leads 310 in the signal channel region is less than 2M, the width of the first power voltage lead 310 can be increased, and the anti-disturbance ability of the array substrate can be improved.

In some embodiments, the 2M+1 control region columns 510 in the signal channel region can be divided into M+1 groups, where one group includes one control region column 510, each of the remaining M groups includes two adjacent control region columns 510, and different groups do not share the same control region column 510. Each group can share the same first power voltage lead 310, so that only M+1 first power voltage leads 310 are required in one signal channel region 500, the width of the first power voltage lead 310 can be increased, and the anti-disturbance ability of the array substrate can be improved.

In some embodiments of the disclosure, referring to FIG. 1, any signal channel region 500 includes two control region columns 510 extending in the first direction D. In any signal channel region 500, the number of the first power voltage lead 310 is one, and the number of the second power voltage lead 320 is two, and they are respectively located on both sides of the first power voltage lead 310.

In this way, compared to the design in which each control region column 510 is provided with a respective first power voltage lead 310, the array substrate according to the disclosure can reduce the number of the first power voltage lead 310 by half, thereby more effectively increasing the width of the power voltage lead 310 and improving the anti-disturbance ability of the array substrate.

Hereinafter, the structure, principle, and effect of the array substrate of the disclosure will be further explained and described in conjunction with the accompanying drawings.

Figure 12:
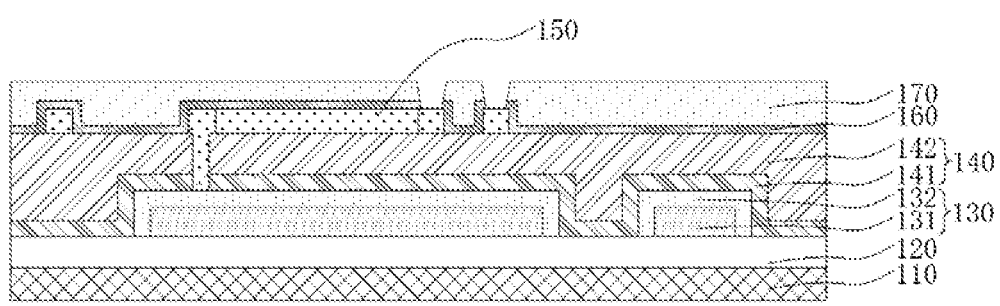
FIG. 12 is a schematic cross-sectional diagram of the array substrate along "MN" in FIG. 2.

Optionally, referring to FIG. 12, the array substrate of the disclosure has a substrate base 110 and one or more metal wiring layers disposed on the substrate base 110. Referring to FIG. 1, the metal wiring layer may form the driving lead 300, the connecting lead 200, the first pad group 410, the second pad group 420 and other required conductive structures of the array substrate. When the array substrate has multiple metal wiring layers, an insulating layer may be provided between two adjacent metal wiring layers, and the insulating layer may include an organic insulating layer, an inorganic insulating layer, or a mixture thereof. A via hole may be provided in the insulating layer to electrically connect the upper and lower metal wiring layers. Further, referring to FIG. 12, the array substrate may be further provided with an insulating protection layer 170, the material of the insulating protection layer 170 may include an organic insulating material, and an opening portion of the insulating protection layer 170 may expose each of the first pad group and the second pad group on the array substrate, and other parts of the insulating protection layer can protect the driving lead and the connecting lead. When the light emitting element and the microchip are provided on the array substrate to form the light emitting substrate, the light emitting element can be electrically connected to the second pad 420 through the connection structure, and the microchip can be electrically connected to the first pad group through the connection structure. The connection structure may be composed of materials such as solder paste or conductive glue, or the connection structure may be a spike-like concave-convex structure composed of hard metal materials. Exemplarily, the functional device can be connected to the device pad through a connection structure composed of solder paste through processes such as printing soldering, die bonding, and reflow soldering.

Figure 8:
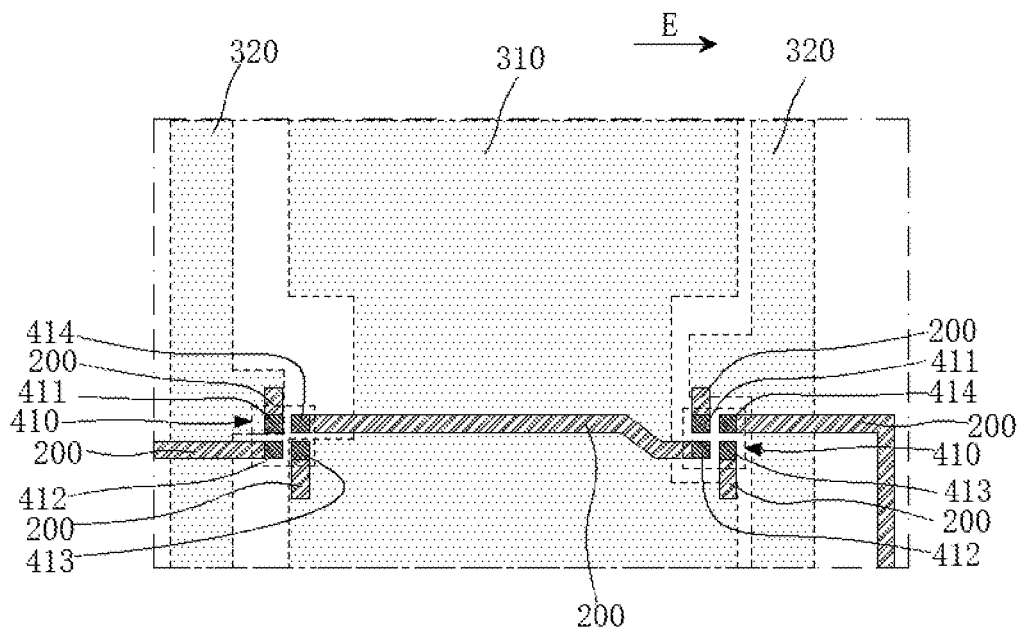
FIG. 8 is a schematic diagram illustrating a structure according to some embodiments of the disclosure, in which the driving leads and the first pad group are respectively located on the first metal wiring layer and the second metal wiring layer.

In some embodiments of the disclosure, referring to FIG. 2, FIG. 4 and FIG. 8, the connecting lead 200, the first pad group 410, and the second pad group 420 may be located on the same metal wiring layer, and the driving lead 300 may be located on another metal wiring layer. Exemplarily, referring to FIG. 12, the array substrate includes a substrate base 110, a first metal wiring layer 130, an insulating material layer 140, and a second metal wiring layer 150 that are sequentially stacked. In some embodiments, the driving lead 300 is located on the first metal wiring layer 130, the connecting lead 200, the first pad group 410, and the second pad group 420 are located on the second metal wiring layer 150; the second metal wiring is electrically connected to the first metal wiring layer 130 through a via hole located on the insulating material layer 140.

Figure 7:
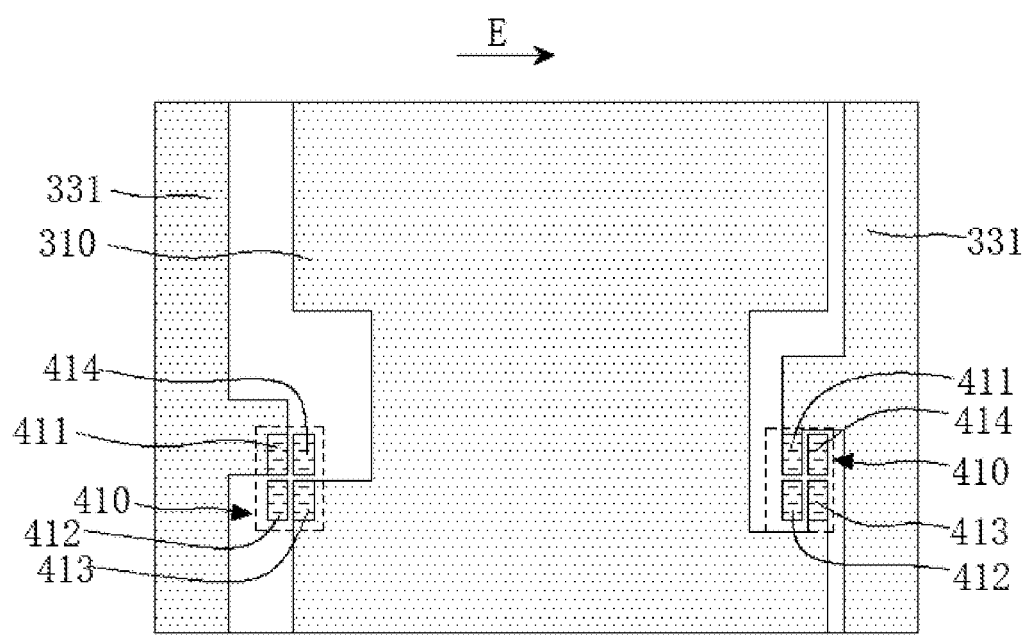
FIG. 7 is a schematic diagram illustrating a structure according to some embodiments of the disclosure, in which the first pad group and the driving leads are located on the first metal wiring layer.

Optionally, in some other embodiments of the disclosure, referring to FIG. 7, the first pad group 410 and the driving lead 300 may also be located on the same metal layer, for example, both are located on the first metal wiring layer.

Optionally, the thickness of the first metal wiring layer 130 is greater than the thickness of the second metal wiring layer 150. By increasing the thickness of the driving lead 300, the signal fluctuation on the driving lead 300 can be reduced, and accordingly, impedance of the first power voltage lead 310 and the second power voltage lead 320 can be reduced, thereby facilitating the debugging of the array substrate.

In some embodiments, the thickness of the first metal wiring layer 130 may be in the range of 1.5-20 microns. In some embodiments, the thickness of the first metal wiring layer 130 may be 1.5-7 microns. The first metal wiring layer 130 may be prepared by a process of copper electroplating or electroless copper plating.

Figure 9:
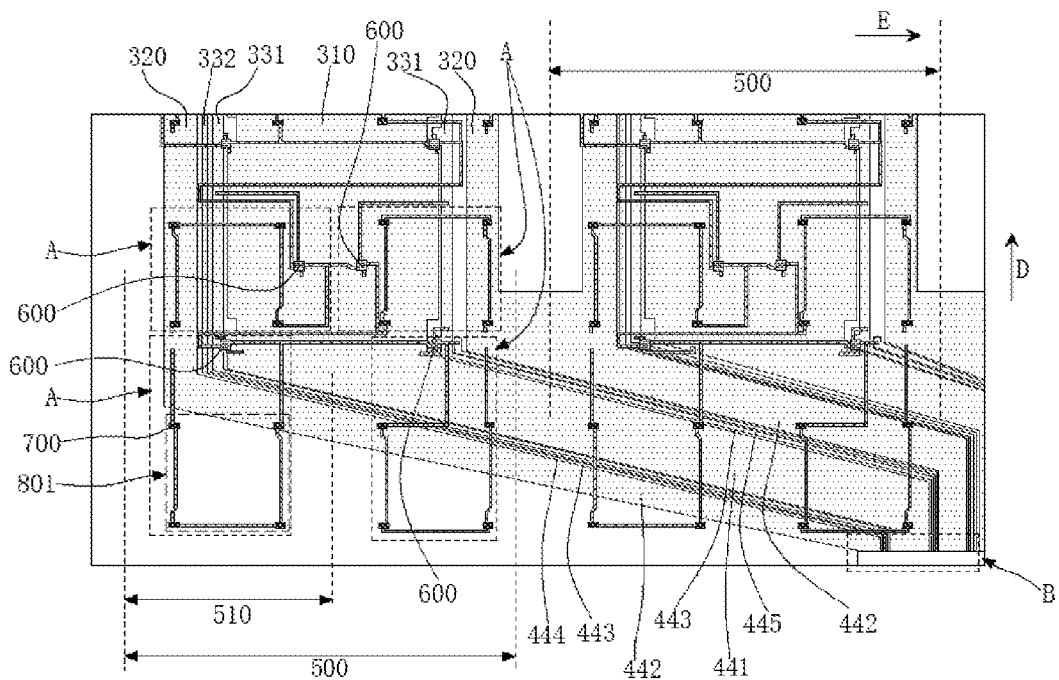
FIG. 9 is a schematic diagram illustrating a partial structure, at an end close to the bonding region, of the microchip, light-emitting elements, first metal wiring layer, and second metal wiring layer in the light-emitting substrate according to some embodiments of the disclosure.

The array substrate according to the disclosure, referring to FIG. 4 and FIG. 9, has the first pad group 410 for binding the microchip 600 and the pad connection circuit 511 electrically connected to the first pad group 410. The pad connection circuit 511 has a second pad group 420 for bonding a functional device. In this way, the microchip 600 and the functional device can be bound on the array substrate to form a functional substrate on which the functional device is actively driven by the microchip 600. The functional device may be a current-driven element, such as a heating element, a light-emitting element 700, a sound-emitting element, or the like, or an electronic element that implements a sensing function, such as a photosensitive element, a heat-sensitive element, or the like.

Exemplarily, the second pad group 420 of the array substrate according to the disclosure can be used to bind the light-emitting element 700, for example, can be used to bind micro light-emitting diodes (including Micro LEDs, Mini LEDs), and the like, so that a light-emitting substrate can be achieved. It is understandable that the second pad group 420 can also be used to bind other sensors, such as temperature sensors, pressure sensors, infrared sensors, and other electronic components. In some embodiments, the second pad group 420 can include multiple sub-pads. plate. In some embodiments, a whole of the second pad group 420 can be used to bind micro light emitting diodes, or the whole thereof can be used to bind sensors and other components. Alternatively, a part of the second pad group 420 can be used to bind micro light emitting diodes, and another part thereof is used to bind sensors Alternatively, even a part of the second pad group 420 may not be bound to any electronic components.

In some embodiments, the array substrate according to the disclosure may further include a third pad group for binding other electronic components. The disclosure does not limit the position, function, and connection relationship of the third pad group, and may be provided based on actual requirements.

In some embodiments, referring to FIG. 4, the second pad group 420 includes a first sub-pad 421 and a second sub-pad 422. In the pad connection circuit 511, when the second pad group 420 is bond to the light-emitting element 700, the first sub-pad 421 and the second sub-pad 422 may be bonded and connected to two electrodes of the light-emitting element 700, respectively.

Figure 11:
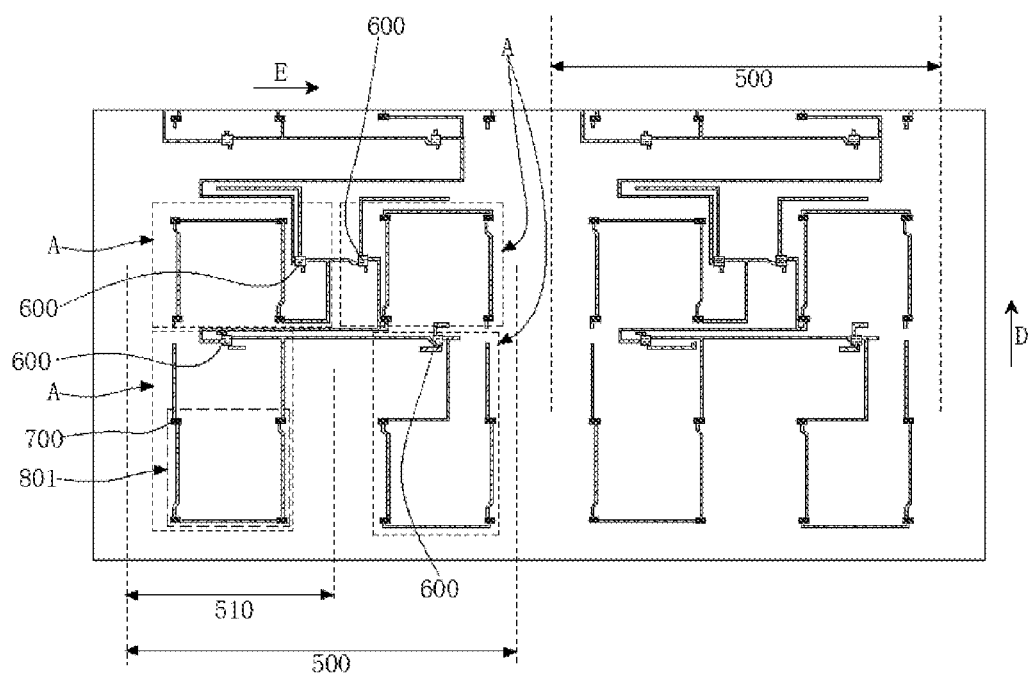
FIG. 11 is a schematic diagram illustrating a structure of the microchip, the light-emitting elements, and the second metal wiring layer in FIG. 9.

Referring to FIG. 4, in one pad connection circuit 511, each second pad group 420 can be connected by connecting lead 200. Referring to FIG. 11, when each second pad group 420 is bound with a light-emitting element 700, the pad connection circuit 511 and the light-emitting element 700 can form a light-emitting circuit 801. Each second pad group 430 may determine its connection mode according to the needs of the light-emitting circuit 801, so that the light-emitting circuit 801 can drive each light-emitting element 700. The pad connection circuit 511 may be configured to be able to implement a series connection, a parallel connection, or a mixed series and parallel connection of the light-emitting elements 700 in the light-emitting circuit 801.

Exemplarily, referring to FIG. 4, any one of the pad connection circuits 511 includes Q second pad groups 420 connected in series in sequence. Herein, the first sub-pad 421 in the first one of second pad groups 420 serves as the second end of the pad connection circuit 511, and is electrically connected to the second power voltage lead 320 through the connecting lead 200. The second sub-pad 422 of the Q-th one of second pad groups 420 serves as the first end of the pad connection circuit 511, and is electrically connected to the first pad group 410 through the connecting lead 200. The second sub-pad 422 in the q-th one of second pad groups 420 and the first sub-pad 421 in the (q+1)-th one of second pad groups 420 are electrically connected through the connecting lead 200, where q is a positive integer, and $1 \leq q \leq Q-1$. In this way, referring to FIG. 11, when the light-emitting element 700 is bound to the pad connection circuit 511 to form the light-emitting circuit 801, the light-emitting elements 700 in the light-emitting circuit 801 are connected in series.

In one pad connection circuit 511, the number of second pad groups 420 as included can be determined according to the needs of the array substrate, for example, it may include 2-8 second pad groups 420. Exemplarily, referring to FIG. 2, one pad connection circuit 511 includes four second pad groups 420.

In some embodiments of the disclosure, each second pad group 420 on the array substrate may be distributed in an array as a whole, so that the light-emitting elements 700 on the light-emitting substrate may be distributed in an array.

In some embodiments, referring to FIG. 2, part of the orthographic projection of the second pad group 420 on the substrate base 110 may be located within the orthographic projection of the first power voltage lead 310 on the substrate base 110; and part of the orthographic projection of the second pad group 420 on the substrate base 110 may be located within the orthographic projection of the second power voltage lead 320 on the substrate base 110. Exemplarily, referring to FIG. 2, one pad connection circuit may include four second pad groups. In some control regions, especially in the control region A that is not close to the bonding region of the array substrate, two second pad groups completely overlap with the first power voltage lead 310, and the other two second pad groups completely overlap with the second power voltage lead 310.

In some other embodiments, part of the second pad group 420 may also not overlap with the first power voltage lead 310 and the second power voltage lead 320. Exemplarily, referring to FIG. 9, in the row of control regions closest to the bonding region, part of the second bonding pad 420 may overlap with the fan-out lead, and part of the second bonding pad 420 may not overlap with the first power voltage lead 310, the second power voltage lead 320, and the fan-out lead.

Figure 3:
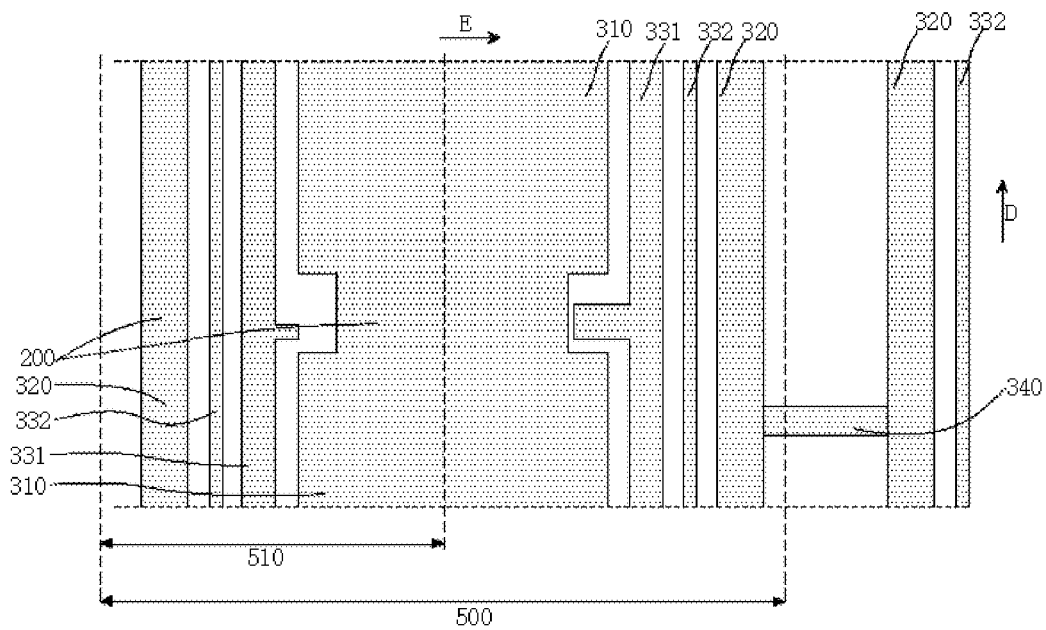
FIG. 3 is a schematic diagram illustrating a structure of the first metal wiring layer in FIG. 2.

Referring to FIG. 1 to FIG. 3, a plurality of driving leads 300 may be arranged in a signal channel region 500, and gaps are required between the driving leads 300 to avoid signal interference between each other. Compared with a design solution in which respective first power voltage lead 310 is provided in the signal channel region corresponding to each control region column, the array substrate according to the embodiment of the disclosure combine at least two of first power voltage leads 310 in each signal channel region into one, thereby reducing the number of driving leads 300 within each signal channel region, and saving the area and space occupied by the gaps required between adjacent driving leads 300. Accordingly, the area of at least one first power voltage lead 310 within each signal channel region can be increased, thereby further reducing the impedance of the first power voltage lead 310. In this way, the stability of the first power voltage VG loaded on the first power voltage lead 310 can be improved without increasing the thickness of the driving lead 320, and the anti-disturbance ability of the array substrate can be improved. Moreover, in the array substrate according to the disclosure, since the area of at least one first power voltage lead 310 within each signal channel region can be increased, in some embodiments, the thickness of the driving lead 300 can be reduced, thereby reducing the cost of the array substrate and, further, making the array substrate thinner and lighter.

Exemplarily, in a design solution of the related art, each signal channel region includes two control region columns, and each control region column is provided with a first power voltage lead 310 having a thickness of, for example, 1.8 microns. In order to reduce the IR voltage drop and reduce the electrical interference between the signal lines, the minimum width of each first power voltage lead 310 is, for example, 8 mm, and the impedance of each first power voltage lead 310 is, for example, 1.58Ω. In the array substrate according to the embodiment of the disclosure, each signal channel region includes two control region columns, and only one first power voltage lead 310 is provided in the two control region columns, and the thickness thereof is 1.8 microns. Accordingly, the minimum width of the first power voltage lead 310 can be at least doubled, for example, increased to 18 mm, and the impedance can be reduced to 0.65Ω. It can be seen that the array substrate according to the embodiment of the disclosure has a lower impedance.

It can be understood that the description of the width, thickness, and impedance of the first power voltage lead 310 in the foregoing embodiments is only exemplary in an implementation manner. In other embodiments of the disclosure, the thickness and width of the first power voltage lead 310 can be adjusted and determined according to the electrical requirements of the first power voltage lead 310, so as to meet the electrical requirements of the array substrate, especially the requirement of the array substrate for low signal disturbance of the first power voltage lead 310. Generally speaking, the shorter the length, the greater the width, and the greater the thickness of the first power voltage lead 310, the lower the resistance of the first power voltage lead 310 and the lower the voltage signal disturbance caused by current fluctuations thereon. The stronger the anti-disturbance ability of the first power voltage lead 310 is, the more the stability of the microchip can be improved. When the size of the array substrate increases, the length of the first power voltage lead 310 can be longer, and the thickness or width of the first power voltage lead 310 can be increased to improve the anti-disturbance ability of the array substrate. In some embodiments, when the size of the array substrate increases, the length of the first power voltage lead 310 increases substantially in a proportional way, so that the resistance value thereof increases substantially proportionally. In other embodiments, when the thickness of the first power voltage lead 310 increases, the resistance value of the first power voltage lead 310 increases substantially in a proportional way.

In some embodiments, the first power voltage VG is a DC constant voltage. The more stable the first power voltage VG loaded on the first power voltage lead 310 and the smaller the fluctuation, the more stable the signal transmission of the array substrate, the better the anti-disturbance ability of the array substrate, and the easier it is to debug.

Referring to FIG. 1, the second direction E is parallel to the plane of the array substrate and perpendicular to the first direction D. In each signal channel region 500, along the second direction E or its opposite direction, two second power voltage leads 320 for loading the second power voltage $V_{LED}$ are respectively located on both sides of the first power voltage lead 310. In some embodiments, the second power voltage $V_{LED}$ may be a driving voltage $V_{LED}$ used to drive each functional device bound to the second pad group 420.

In some embodiments, the second power voltage is a DC constant voltage. The more stable the second power voltage loaded on the second power voltage lead 320 and the smaller the fluctuation, the more stable the signal transmission of the array substrate, the better the anti-disturbance ability of the array substrate, and the easier it is to debug. Referring to FIG. 2, two adjacent second power voltage leads 320 respectively located in two different signal channel regions 500 are electrically connected to each other. In this way, when the signals on two adjacent second power voltage leads 320 are inconsistent, signal shunting can be achieved by the two connected second power voltage leads 320, thereby avoiding signal overload on the second power voltage leads 320. In this way, the array substrate has better anti-overload performance.

Optionally, referring to FIG. 2 and FIG. 3, the array substrate further includes a plurality of conductive connecting parts 340, and two adjacent second power voltage leads 320 are connected by the plurality of conductive connecting parts 340. In this way, two adjacent second power voltage leads 320 are connected by the plurality of conductive connecting parts 340 to form a grid shape, thereby not only allowing sufficient and effective signal shunting between the two second power voltage leads 320, but also avoiding an excessively large proportion of metal area in the metal wiring layer due to complete combination of the two adjacent second power voltage leads 320 into one second power voltage lead 320.

It is to be understood that in some other embodiments, two adjacent second power voltage leads 320 can also be completely merged into one second power voltage lead 320, so as to reduce the impedance of the second power voltage lead 320 and increase its anti-overload performance. Further, the ratio of metal area in the metal wiring layer can be adjusted by adjusting the spacing between different driving leads, hollowing out part of the first power voltage lead 310 and/or the second power voltage lead 320, thereby meeting the preparation processing requirements of the array substrate.

In some embodiments of the disclosure, referring to FIG. 2, the conductive connecting part 340 and the second power voltage lead 320 may be located on the same metal wiring layer. Exemplarily, the conductive connecting part 340 and the second power voltage lead 320 may both be located on the first metal wiring layer 130, and the conductive connecting part 340 is located between two adjacent second power voltage leads 320 and is connected to the two adjacent second power voltage leads 320, so that a grid shape is formed by the two adjacent second power voltage leads 320 and the conductive connecting part 340 therebetween.

In some embodiments, part or all of the conductive connecting part 340 may also be located on a different metal wiring layer from the second power voltage lead 320. For example, in some embodiments of the disclosure, the second power voltage lead 320 is located on the first metal wiring layer 130, the conductive connecting part 340 is located on the second metal wiring layer 150, and the conductive connecting part 340 is connected to the two adjacent second power voltage leads 320 through a via hole. For another example, in some embodiments of the disclosure, the second power voltage lead 320 is located on the first metal wiring layer 130, and the conductive connecting part 340 includes a first portion and a second portion, wherein the first portion is located on the first metal wiring layer 130 and is connected to one of the second power voltage leads 320, and the second portion is located on the second metal wiring layer 150 and is connected to the first part and the other one of the second power voltage leads 320 through a via hole.

Referring to FIG. 2, the driving lead 300 further includes at least a microchip driving lead 330 connected to the first pad group 410 and used for driving the microchip 600. In any signal channel region 500, the microchip driving lead 330 is located between the first power voltage lead 310 and the second power voltage lead 320. In this way, along the second direction E or its opposite direction, the two second power voltage leads 320 are respectively located at opposite sides of the signal channel region 500, and other driving leads 320 in the signal channel region 500 are located between the two second power voltage leads 320. This facilitates the electrical connection of the two adjacent second power voltage leads 320 in the two adjacent signal channel regions 500, and can make the first power voltage lead 310 and the second power voltage lead 320 away from each other, thereby reducing the possibility of signal cross-interference between different driving leads 300.

Figure 5:
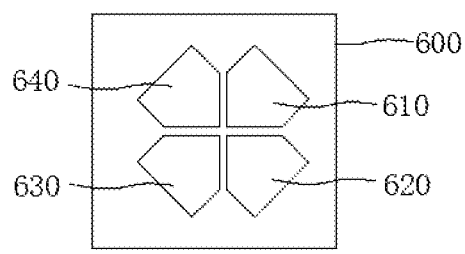
FIG. 5 is a schematic diagram illustrating a pins structure of the microchip according to some embodiments of the disclosure.
Figure 6:
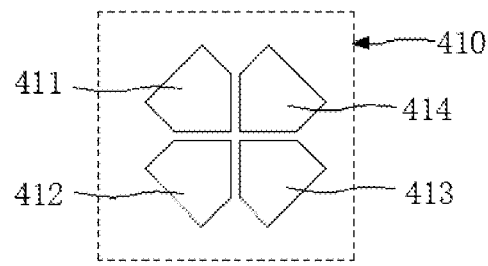
FIG. 6 is a schematic diagram illustrating a structure of the first pad group according to some embodiments of the disclosure.

Referring to FIG. 6, any one of the first pad groups 410 includes at least a first input signal sub-pad 411 for loading a first input signal Pwr, a first power voltage sub-pad 413 for loading the first power voltage VG, and at least one output sub-pad 414 for loading output signals. Correspondingly, referring to FIG. 5, the microchip 600 on the light-emitting substrate includes at least a first input signal pin 610 for bonding and connecting with the first input signal sub-pad 411, a first power voltage pin 630 for bonding and connecting with the first power voltage sub-pad 413, and at least one output pin 640 for bonding and connecting with each output sub-pad 414 in a one-to-one correspondence. In the light-emitting substrate, the array substrate can provide the first input signal Pwr to the microchip 600 through the first input signal sub-pad 411, provide the first power voltage VG to the microchip 600 through the first power voltage sub-pad 413, and receive the signal output by the microchip 600 through the output sub-pad 414. Optionally, the first input signal Pwr may be a chip power voltage or a power line carrier communication signal, and the power line carrier communication signal includes a communication signal for controlling the light-emitting element 700 to emit light.

Optionally, the first power voltage sub-pad 413 is directly connected to the first power voltage lead 310 or connected thereto through the connecting lead 200. Exemplarily, in some embodiments of the disclosure, referring to FIG. 8 and FIG. 12, the first power voltage sub-pad 413 is located on the second metal wiring layer 150, and the first power voltage lead 310 is located on the first metal wiring layer 130. The first power voltage sub-pad 413 is connected to the connecting lead 200 located on the second metal wiring layer 150, and the connecting lead 200 is connected to the first power voltage lead 310 through a via hole. Exemplarily, in some embodiments, referring to FIG. 7 and FIG. 12, the first power voltage sub-pad 413 and the first power voltage lead 310 are both located on the first metal wiring layer 130 and are directly connected with each other. The insulating material layer of the array substrate is provided with a via hole exposing at least a part of the first power voltage sub-pad 413, so that the first power voltage pin 630 of the microchip 600 can be bound to the first power voltage sub-pad 413 through the via hole. Exemplarily, in some embodiments of the disclosure, the first power voltage sub-pad 413 is located on the second metal wiring layer 150, and the first power voltage lead 310 is located on the first metal wiring layer 130; an orthographic projection of the first voltage sub-pad 413 on the substrate base 110 overlaps with an orthographic projection of the first power voltage lead 310 on the substrate base 110, and the first power voltage sub-pad 413 is connected to the first power voltage lead 310 through a via hole.

Optionally, referring to FIG. 4 and FIG. 6, in any one control region A, at least one pad connection circuit 511 and the output sub-pad 414 in at least one first pad group 410 are arranged in a one-to-one correspondence, and a first end of each pad connection circuit 511 is connected to a corresponding output sub-pad 414 through the connecting lead 200. In this way, in the light-emitting substrate, the signal output by the microchip 600 can be applied to the pad connection circuit 511 for driving the light-emitting state of each light-emitting element 700 connected to the pad connection circuit 511.

In some embodiments of the disclosure, the output sub-pad 414 and the second pad group 420 are located on the same metal wiring layer, for example, both are located on the second metal wiring layer 150.

Optionally, referring to FIG. 1 to FIG. 3, in any signal channel region 500, the microchip drive lead 330 includes at least one first input signal lead 331 located between the first power voltage lead 310 and the second power voltage lead 320. The first input signal sub-pad 411 is directly connected to the first input signal lead 331 or connected thereto through the connecting lead 200. Exemplarily, in some embodiments of the disclosure, referring to FIG. 8 and FIG. 12, the first input signal sub-pad 411 is located on the second metal wiring layer 150, and the first input signal lead 331 is located on the first metal wiring layer 130. The first input signal sub-pad 411 is connected to the connecting lead 200 located on the second metal wiring layer 150, and the connecting lead 200 is connected to the first input signal lead 331 through a via hole. Exemplarily, in some embodiments, referring to FIG. 7 and FIG. 12, the first input signal sub-pad 411 and the first input signal lead 331 are both located on the first metal wiring layer 130, and they are directly connected with each other. The insulating material layer 140 of the array substrate is provided with a via hole exposing at least a part of the first input signal sub-pad 411, so that the first input signal pin 610 of the microchip 600 is bound to the first input signal sub-pad 411 through the via hole. Exemplarily, in some embodiments of the disclosure, the first input signal sub-pad 411 is located on the second metal wiring layer 150, and the first input signal lead 331 is located on the first metal wiring layer 130; an orthographic projection of the first input signal sub-pad 411 on the substrate base 110 overlaps with an orthographic projection of the first input signal lead 331 on the substrate base 110, and the first input signal sub-pad 411 is connected to the first input signal lead 331 through the via hole.

In some embodiments of the disclosure, in any signal channel region 500, the number of the first input signal leads 331 is the same as the number of the control region columns 511, for example two, so that the first input signal leads 331 can be respectively located on both sides of the first power voltage lead 310.

Further optionally, referring to FIG. 1, FIG. 2 and FIG. 6, in any one of the signal channel regions 500, along the second direction E, the first one of control region columns 510 corresponds to the first one of second power voltage leads 320 and the first one of first input signal leads 331, the second one of control region columns 510 corresponds to the second one of second power voltage leads 320 and the second one of first input signal leads 331. The second end of each pad connection circuit 511 in the control region column 510 is electrically connected to the corresponding second power voltage lead 320 through the connecting lead 200, and each first input signal sub-pad 411 in the control region column 510 is connected to the corresponding first input signal lead 331 through the connecting lead 200.

In this way, in the light-emitting substrate, two control region columns 510 are respectively provided with corresponding second power voltage leads 320 and first input signal leads 331. Meanwhile, the same one of first power voltage leads 310 is shared by two control region columns 510 in the same signal channel region 500.

Optionally, referring to FIG. 1 and FIG. 2, in any signal channel region 500, the microchip driving lead 330 further includes a second input signal lead 332. Referring to FIG. 6, the first pad group 410 further includes a second input signal sub-pad 412; the second input signal lead 332 is used for loading a second input signal Di to at least one second input signal sub-pad 412. Correspondingly, referring to FIG. 5, the microchip 600 used for binding with the first pad group 410 may further include a second input signal pin 620 used for binding with the second input signal sub-pad 412. In this way, the microchip 600 can receive the second input signal Di through the second input signal pin 620. Optionally, the second input signal Di may be an address signal, or a strobe signal for turning on the first input signal pin 610 to receive the first input signal Pwr.

In the disclosure, each first pad group 410 in any signal channel region 500 is connected to the same one of second input signal leads 332. In other words, one signal channel region 500 is composed of each control region A corresponding to each first pad group 410 directly or indirectly connected to the same second input signal lead 332. When a second input signal lead 332 is used for directly or indirectly driving multiple control region columns, the multiple control region columns form a signal channel region 500. Exemplarily, when one signal channel region 500 includes two control region columns 510, the two control region columns 510 share the same second input signal lead 332. For another example, when one signal channel region 500 includes more than three control region columns 510, the three or more control region columns 510 share the same second input signal lead 332.

Referring to FIG. 5, the microchip 600 has a first input signal pin 610, a first power voltage pin 630, an output pin 640, and a second input signal pin 620. The first power voltage pin 630 is used for providing the first power voltage VG to the microchip 600, the first input signal pin 610 is used for providing the first input signal Pwr to the microchip 600, and the second input signal pin 620 is used for providing the second input signal Di to the microchip 600. In some embodiments, the microchip 600 may be configured to, according to the first input signal Pwr loaded on the first input signal pin 610 and the second input signal Di loaded on the second input signal pin 620, output a relay signal through the output pin 640 within a first time period, and output a driving signal for driving the light-emitting element 700 to emit light through the output pin 640 in a second time period. In some embodiments, the relay signal is an address signal or a strobe signal. After the second input pin of the microchip 600 loads the relay signal, the microchip 600 can receive the first input signal Pwr through the first input pin. The first input signal Pwr is a power line carrier communication signal, which can provide a communication signal while providing a driving voltage to the microchip.

Optionally, in any signal channel region 500, the second input signal lead 332 is located between the first input signal lead 331 and the second power voltage lead 320.

Optionally, each second input signal sub-pad 412 and each output sub-pad 414 are located on the same metal wiring layer. In some embodiments of the disclosure, each of the second input signal sub-pads 412 and each of the output sub-pads 414 are located on the second metal wiring layer 150.

In some embodiments of the disclosure, referring to FIG. 1 and FIG. 6, in any signal channel region 500, there are P first pad groups 410 numbered sequentially according to a preset order. For example, the second input signal sub-pad 412 of the first pad group 410 numbered 1 is connected to the second input signal lead 332 through the connecting lead 200, and the output sub-pad 414 of the first pad group 410 numbered p is electrically connected the second input signal sub-pad 412 of the first pad group 410 numbered (p+1) through the connecting lead 200, where 0<p<P, and p and P are both integers. In this way, in the light-emitting substrate, each first pad group 410 can be bound with a microchip, and the number of the microchip can be the same as the number of the first pad group 410.

After the second input signal Di is loaded on the second input signal pin of the first one of microchips 600, the first one of microchips 600 can receive the first input signal Pwr loaded on the first input signal pin. Then, according to the first input signal Pwr and the second input signal Di, a relay signal is output in a subsequent first time period, and a driving light signal for driving the light-emitting element 700 to emit light is output in the second time period. After the microchip 600 numbered (p+1) receives the relay signal output by the microchip 600 numbered p through the second input signal pin, it can receive the first input signal Pwr loaded on the first input signal pin. Then, the relay signal is output in the subsequent first time period, and the driving light signal for driving the light-emitting element 700 to emit light is output in the second time period. In this way, the microchips 600 in one signal channel region 500 are sequentially cascaded, thereby driving each light-emitting element 700 in the corresponding control region A to emit light.

Optionally, the array substrate is provided with a bonding region B. In any signal channel region 500, there are 2M control region columns, and each control region column 510 includes N control regions A. M and N are both positive integers, and P=2M*N. The first pad group 410 numbered 1 is the one closest to or farthest from the bonding region B in the signal channel region 500; and the P first pad groups 410 can be numbered row by row and column by column according to a Z-shape, or numbered row by row and column by column according to a S-shape, or numbered row by row and column by column according to a N-shape, or numbered row by row and column by column according to a U-shape or an inverted U-shape. In some embodiments of the disclosure, the row direction is a direction along the second direction or its opposite direction, and the column direction is a direction along the first direction or its opposite direction.

Exemplarily, any signal channel region 500 includes 2M control region columns, and each control region column 510 includes N control regions A, where M and N are both positive integers, and P=2M*N. Taking M=1 as an example for description, in a signal channel region 500, the first pad group 410B(1, i) is the first pad group 410 in the i-th row of control region A in the first one of control region columns 510, that is the first pad group 410 numbered 2i−1. The first pad group 410B(2, i) is the first pad group 410 in the i-th row of control region A in the second one of control region columns 510, that is, the first pad group 410 numbered 2i. The first pad group 410B(1, i+1) is the first pad group 410 in the (i+1)-th row of control region A in the first one of control region columns 510, that is, the first pad group 410 numbered 2i+1, where i is a positive integer less than N. The first pad group 410B (1, 1) is the first pad group 410 in the first one of control region A in the first one of control region columns 510, that is, the first pad group 410 numbered 1. the first pad group 410B(1, N) is the first pad group 410 in the N-th row of control regions A in the first one of control region columns 510, that is, the first pad group 410 numbered P−1; the first pad group 410B(2, N) is the first pad group 410 in the N-th row of control regions A in the second one of control region columns 510, That is, the first pad group 410 numbered P.

In any signal channel region 500, the second input signal sub-pad 412 of the first pad group 410B (1, 1) is connected to the second input signal lead 332 through the connecting lead 200; the output sub-pad 414 of the first pad group 410B (1, i) is connected to the second input signal sub-pad 412 of the first pad group 410B(2, i) through the connecting lead 200; the output sub-pad 414 of the first pad group 410B(2, i) is connected to the second input signal sub-pad 412 of the first pad group 410B(1, i+1) through the connecting lead 200; the output sub-pad 414 of the first pad group 410B(1, N) is connected to the second input signal sub-pad 412 of the first pad group 410B (2, N) through the connecting lead 200.

In this way, in one signal channel region 500, the array substrate includes 2N first pad groups 410 sequentially cascaded. Correspondingly, a signal channel region 500 of the light-emitting substrate includes 2N microchips 600 cascaded in sequence, and the output pin 640 of an upper-level microchip 600 is connected to the second input pin of a next-level microchip 600 through the connecting lead 200.

Optionally, referring to FIG. 9 to FIG. 11 and FIG. 13, the array substrate further includes a bonding region B, and the bonding region B is provided with bonding pads 430 respectively connected to each driving lead 300. The control region A farthest from the bonding region B in any control region column 510 is the first one of control regions A in the control region column 510. In other words, in the light-emitting substrate, among the multiple microchips 600 cascaded in one signal channel region 500, the first-level microchip 600 is located at the end of the signal channel region 500 away from the bonding pad 430, and the last-level microchip 600 is located at one end of the signal channel region 500 close to the bonding pad 430.

In some embodiments, the first pad group 410 may include a plurality of sub-pads. Each first pad group 410 may be arranged close to the first power voltage lead 310, so that an orthographic projection of each sub-pad of the first pad group 410 on the substrate base 110 will not overlap with an orthographic projection of the second power voltage lead 320 on the substrate base 110. In some embodiments of the disclosure, a part of the first pad group 410 may partially overlap with the first power voltage lead 310. That is, referring to FIG. 8, the orthographic projection of part of the sub-pads of one pad group on the substrate base 110 coincides with the orthographic projection of the first power voltage lead 310 on the substrate base 110, and the orthographic projection of remaining sub-pads on the substrate base 110 does not coincide with the orthographic projection of the first power voltage lead 310 on the substrate base 110. In some other embodiments of the disclosure, part of the first pad group 410 may not overlap with the first power voltage lead 310. That is, referring to FIG. 8, the orthographic projection of all the sub-pads of one first pad group 410 on the substrate base 110 does not coincide with the orthographic projection of the first power voltage lead 310 on the substrate base 110. In some embodiments of the disclosure, each sub-pad of part of the first pad group 410 may overlap with the first power voltage lead 310. Referring to FIG. 9, three rows of microchips 600 are shown in FIG. 9, and each microchip 600 is provided with a first pad group 410; in the second row of the first pad groups 410 (hidden by the microchip 600), the orthographic projection of each first pad group 410 on the substrate base 110 is completely located within the orthographic projection of the first power voltage lead 310 on the substrate base 110.

In some embodiments of the disclosure, each of the first pad groups 410 can be arranged far away from the second power voltage lead 320, so as to avoid the interference of voltage fluctuation caused by the current fluctuation of the second power voltage lead 320 on the microchip, thereby improving the stability of electromagnetic environment in which the microchip works. Correspondingly, the first pad group 410 is arranged as close as possible to the first power voltage lead 310 or is completely located within the first power voltage lead 310. Since the first power voltage lead 310 according to the disclosure has the feature of low resistance, the voltage disturbance caused by the current fluctuation thereon is very small, thereby enabling the first power voltage lead 310 to not only provide a stable first power voltage to the microchip, but also to stabilize the electromagnetic environment around the first power voltage lead 310 and reduce the impact of electromagnetic interference on the microchip.

Optionally, in the light-emitting substrate based on the array substrate, in the same control region column 510, the microchips 600 may be arranged along the first direction D, or partially arranged along the first direction D and the rest are arranged dispersedly, as long as achieving electrical connection as required. Exemplarily, referring to FIG. 11, in a control region column 510, except for the microchip 600 that is the second closest to the bonding region B, the other microchips 600 are arranged in a straight line along the first direction D; and the microchip 600 that is the second closest to the bonding region B may be arranged as deviating from the straight line where the other microchips 600 are located, so as to avoid the connecting leads 200.

Figure 13:
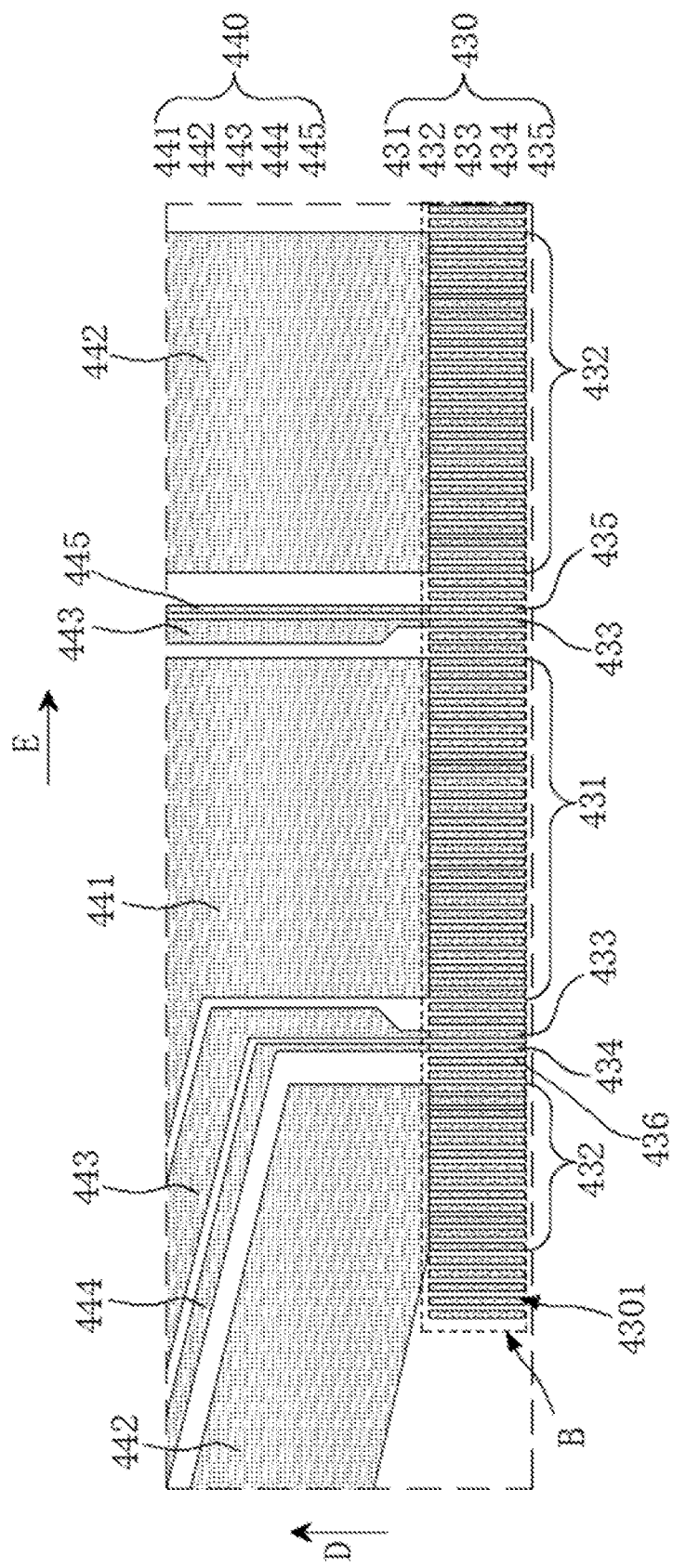
FIG. 13 is an enlarged schematic diagram of the region C in FIG. 9.

Referring to FIG. 9 and FIG. 13, the bonding region B may be disposed close to an edge of the array substrate, and it may be provided with at least one row of bonding pads 430. Further, in the same row of bonding pads 430, each bonding pad 430 may be arranged along the second direction E. In some embodiments of the disclosure, each bonding pad 430 is arranged in a row along the second direction E, and is arranged in a one-to-one correspondence with the driving leads 300.

Exemplarily, referring to FIG. 9 and FIG. 13, a row of bonding pads 430 may be provided in the bonding region B, and the row of bonding pads 430 includes a first power voltage bonding pad 431 for connecting with the first power voltage lead 310, a second power voltage bonding pad 432 for connecting with the second power voltage lead 320, a first input signal bonding pad 433 for connecting with the first input signal lead 331, and a second input signal bonding pad 434 for connecting with the second input signal lead 332.

Optionally, referring to FIG. 9 and FIG. 13, the array substrate further includes a plurality of fan-out leads 440, and each fan-out lead 440 is arranged in a one-to-one correspondence with the bonding pads 430, and each bonding pads 430 is connected to a corresponding driving lead 300 through a corresponding fan-out lead 440.

Exemplarily, referring to FIG. 9 and FIG. 13, the fan-out leads 440 include a first power voltage fan-out lead 441 connected to the first power voltage lead 310 and the first power voltage binding pad 431, a second power voltage fan-out lead 442 connected to the second power voltage lead 320 and the second power voltage bonding pad 432, a first input signal fan-out lead 443 connected to the first input signal lead 331 and the first input signal bonding pad 433, and a second input signal fan-out lead 444 connected to the second input signal lead 332 and the second input signal bonding pad 433.

Optionally, referring to FIG. 9 and FIG. 13, the bonding region B is also provided with a floating bonding pad 435, the floating bonding pad 435 is connected to the output sub-pad 414 of the first pad group 410 at the last stage (hidden by the microchip 600 in FIG. 9). Further, the fan-out lead 440 includes a floating fan-out lead 445 for connecting the output sub-pad 414 of the first pad group 410 at the last stage and the floating bonding pad 435. Exemplarily, the floating bonding pad 435 is connected to the output sub-pad 414 of the first pad group 410B (2, N). In this way, a loop feedback of signal on the second input signal lead can be realized, which is beneficial to realize the detection and debugging of the array substrate.

Figure 10:
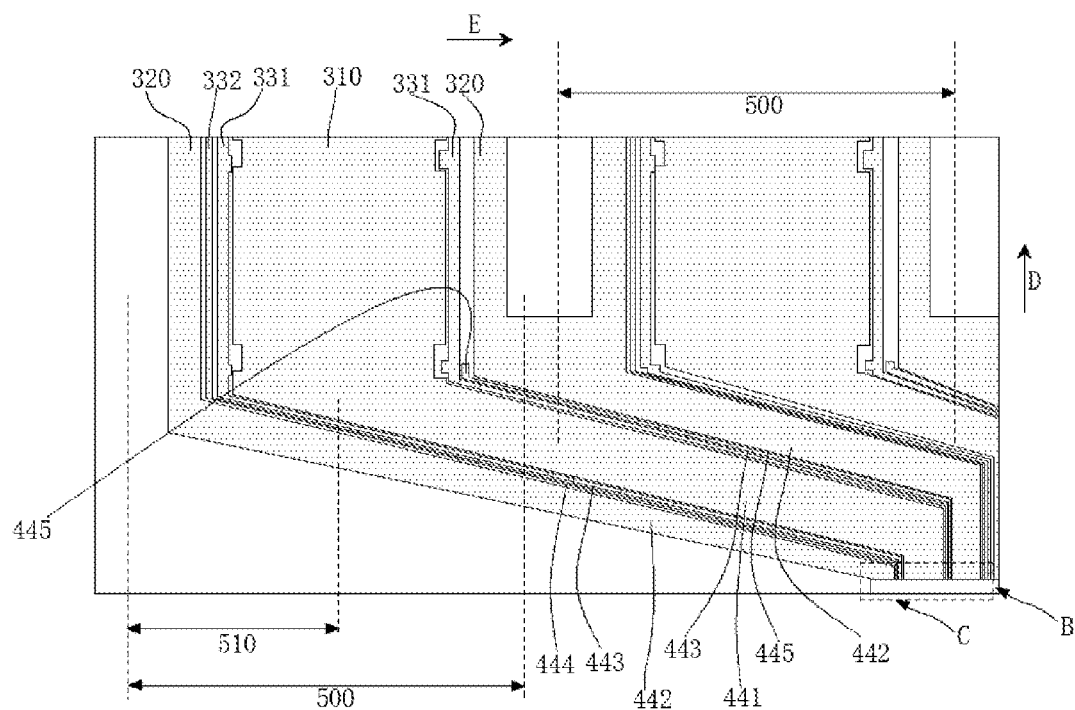
FIG. 10 is a schematic diagram illustrating a structure of the first metal wiring layer in FIG. 9.
Figure 14:
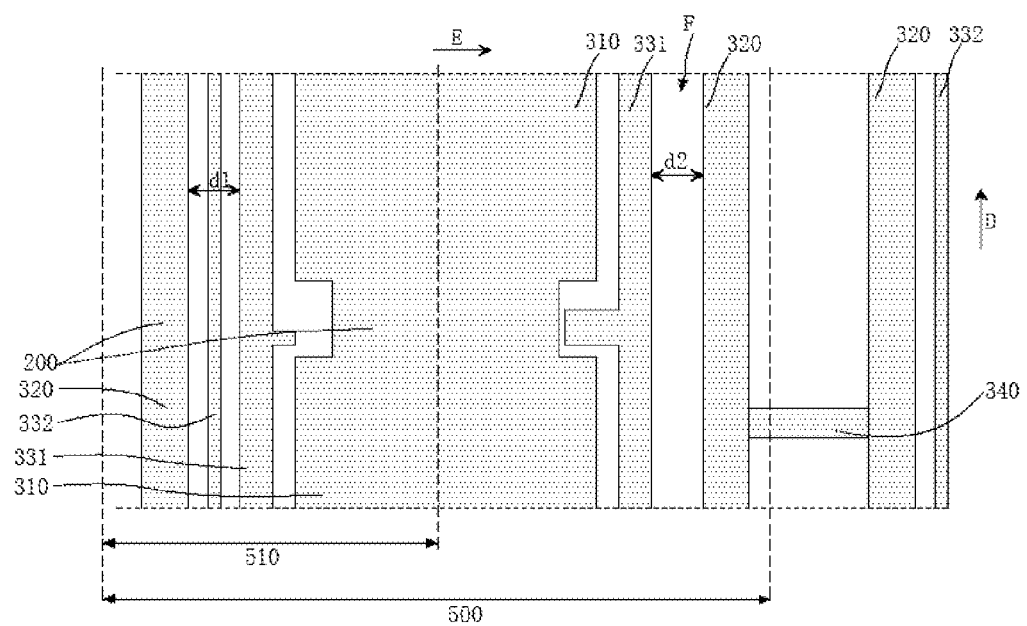
FIG. 14 is a schematic diagram illustrating a structure of the first metal wiring layer in FIG. 2.

Optionally, referring to FIG. 9 and FIG. 10, in any signal channel region 500, along the second direction E, the second input signal lead 332 is located between the first one of second power voltage leads 320 and the first one of first input signal leads 331; the distance d1 between the first one of second power voltage leads 320 and the first one of first input signal leads 331 is equal to the distance d2 between the second one of second power voltage leads 320 and the second one of first input signal leads 331. In this way, referring to FIG. 14, a blank region F is reserved between the second one of second power voltage leads 320 and the second one of first input signal leads 331, thereby reducing the proportion of metal area in the first metal wiring layer 130 on the array substrate. Therefore, it can be avoided that the metal area of the first metal wiring layer 130 is too large to affect the subsequent manufacturing process of the array substrate.

Optionally, each bonding pad 430 may be divided into at least one bonding pad group corresponding to at least one signal channel region 500 one-to-one, and any bonding pad group includes a plurality of bonding pads 430 connected in one-to-one correspondence with multiple driving leads 300 in a signal channel. In other words, the bonding region B is provided with at least one bonding pad group corresponding to at least one signal channel region 500 one-to-one; each bonding pad 430 in a bonding pad group is in one-to-one correspondence with respective driving leads 300 within the corresponding signal channel region 500.

Further optionally, along a direction perpendicular to the first direction D, the multiple driving leads 300 in any one signal channel region 500 are arranged in the same order as the multiple bonding pads 430 connected to each of the multiple driving leads 300. In this way, the fan-out leads 440 corresponding to the bonding pads 430 one-to-one can also be arranged in the same order, so that the connection can be completed without crossing wires.

Optionally, each bonding pad 430, each fan-out lead 440, and each driving lead 300 are located on the same metal wiring layer, for example, located on the first metal wiring layer 130.

Optionally, referring to FIG. 10 and FIG. 13, two of second power voltage bonding pads 432 correspondingly connected to the two adjacent second power voltage leads 320 in the two adjacent signal channel regions 500 are connected to each other as a whole. Furthermore, two fan-out leads 440 connected to the two adjacent second power voltage bonding pads 432 may also be connected to each other to form a whole. In this way, it is equivalent to that two adjacent second power voltage leads 320 are connected to the same second power voltage bonding pad 432 through the same fan-out lead 440. Furthermore, the width of the second power voltage bonding pad 432 connected with two second power voltage leads 320 can be twice the width of the second power voltage bonding pad 432 connected with one second power voltage lead 320. Herein, the width of the bonding pad 430 refers to its size in the second direction E.

Optionally, the width of each bonding pad 430 may be different according to the different driving leads 300 connected thereto. Referring to FIG. 13, the first power voltage bonding pad 431 has a large width to ensure that the loaded first power voltage VG has a small disturbance. The second power voltage bonding pad 432 may also have a large width to ensure that the applied second power voltage $V_{LED}$ has a small disturbance. The first input signal bonding pad 433 and the second input signal bonding pad 434 may have a smaller width, so as to reduce the overall width of the bonding region B and facilitate the connection between the array substrate and the circuit board. In some embodiments, the circuit board may be a flexible circuit board or a chip on film (COF). Further, the width of the first input signal bonding pad 433 may be not smaller than the second input signal bonding pad 434, so as to ensure that the first input signal bonding pad 433 loads the power line carrier communication signal in a more effective way, thereby enabling the first input signal Pwr to provide a chip power voltage for driving the microchip 600, and provide a communication signal for controlling the light-emitting element 700 to emit light.

In some embodiments of the disclosure, the second power voltage bonding pad 432 connected to the second power voltage lead 320 for driving one control region column 510 may have a width of approximately the same as half of the width of the first power voltage bonding pad 431 connected to the first power voltage lead 310 for driving one signal channel region 500. In some embodiments of the disclosure, "approximately" refers to acceptable fluctuations or adjustments of variable amounts such as size, quantity, thickness, and the like, within a range of ±10%.

In some embodiments of the disclosure, the width of the second power voltage bonding pad 432 commonly connected by two adjacent second power voltage leads 320 may be approximately the same as the width of the first power voltage bonding pad 431 connected to the first power voltage lead 310 for driving one signal channel region 500.

In some embodiments of the disclosure, the width of the first input signal bonding pad 433 is the same as that of the second input signal bonding pad 434.

Optionally, the bonding pad 430 may include one or more bonding electrodes 4301 connected to the same fan-out lead 440, and the width of the bonding pad 430 is a total size occupied by each bonding electrode 4301 in the second direction E. The greater the number of bonding electrodes

4301 of the bonding pad 430, the greater the width of the bonding pad 430. In some other embodiments, the multiple bonding electrodes 4301 in the bonding pad 430 connected to the same fan-out lead 440 may be formed into an integral structure in a subsequent process.

In some embodiments of the disclosure, referring to FIG. 13, each bonding pad 430 may include one or more bonding electrodes 4301, and there is a gap between every two bonding electrode 4301. The number of bonding electrodes 4301 included in each bonding pad 430 can be adjusted to determine the width of each bonding pad 430.

For example, referring to FIG. 13, a plurality of bonding electrodes 4301 arranged at equal intervals along the second direction E may be provided in the bonding region B. One bonding electrode 4301 or a plurality of adjacent bonding electrodes 4301 may form one bonding pad 430, and each bonding electrode 4301 is not multiplexed between the bonding pads 430.

The first power voltage bonding pad 431 may include a plurality of bonding electrodes 4301 that are sequentially adjacent, for example, may include 20 to 30 bonding electrodes 4301 that are sequentially adjacent. Exemplarily, the first power voltage bonding pad 431 may include 26 bonding electrodes 4301 that are sequentially adjacent.

The second power voltage bonding pad 432 may include a plurality of bonding electrodes 4301 that are sequentially adjacent, for example, may include 10 to 15 bonding electrodes 4301 that are sequentially adjacent. Exemplarily, the second power voltage bonding pad 432 may include 13 bonding electrodes 4301 that are sequentially adjacent. Furthermore, the two second power voltage bonding pads 432 connected to the two adjacent second power voltage leads 320 can be connected as one second power voltage bonding pad 432, then the bonding pad 430 used for driving the two second power voltage leads 320 may include 20 to 30 bonding electrodes 4301 that are sequentially adjacent, for example, include 26 bonding electrodes 4301 that are sequentially adjacent.

In some embodiments, the first input bonding pad 430, the second input bonding pad 430, and the floating bonding pad 435 may each include 1 to 3 bonding electrodes 4301, for example, may each include one bonding electrode 4301.

Further, referring to FIG. 13, there is no other bonding electrode 4301 between two adjacent second input bonding pads 430. Dummy electrodes 436 that are not coupled to any structure on the array substrate may be provided between adjacent second power voltage bonding pad 432 and first input bonding pad 430, between adjacent first power voltage bonding pad 431 and second input bonding pad 430, and between adjacent first power voltage bonding pad 431 and floating bonding pad 435, thereby facilitating the connection between the array substrate and the circuit board.

Optionally, referring to FIG. 10 and FIG. 13, the fan-out lead 440 includes a first straight segment connected to the driving lead 300, a second straight segment connected to the first bonding pad 430, and an oblique segment connecting the first straight segment and the second straight segment. In some embodiments, the width of the first straight segment may be the same as the width of the connected driving lead 300; the width of the second straight segment may be not less than the width of the connected bonding pad 430. As extending from an end connected to the first straight segment to another end connected to the second straight segment, the width of the oblique segment uniformly transitions from the width of the first straight segment to the width of the second straight segment. In some embodiments, the extending directions of the first straight segment and the second straight segment are both the first direction D, and the extending direction of the oblique segment and the extending direction of the driving lead 300 are at an acute angle. The widths of the first straight segment, the second straight segment, and the oblique segment are their dimensions in the second direction E. Further, the width of the driving lead 300 is greater than the width of the bonding pad 430 connected thereto, so that the width of the oblique segment gradually decreases in a direction toward the bonding region B.

Exemplarily, referring to FIG. 13, the width of the second straight segment of the first power voltage fan-out lead 441 is equal to the width of the first power voltage binding pad 431; the width of the second straight segment of the second power voltage fan-out lead 442 is equal to the width of the second power voltage bonding pad 432; the width of the second straight segment of the second input signal fan-out lead 444 is equal to the width of the second input signal bonding pad 434; the width of the second straight segment of the floating fan-out lead 445 is equal to the width of the floating bonding pad 435. The second straight segment of the first input signal fan-out lead 443 has a width at an end far away from the first input signal bonding pad 433 greater than a width at another end near the first input signal bonding pad 433.

As an example, referring to FIG. 12, the array substrate includes a substrate base 110, a buffer layer 120, a first metal wiring layer 130, a first passivation layer 141, a planarization organic material layer 142, and a second metal wiring 150, a second passivation layer 160 and an insulating protection layer 170 that are stacked in sequence. In some embodiments, the first passivation layer 141 and the planarization organic material layer 142 form the insulating material layer 140 of the array substrate according to the disclosure.

In some embodiments, the substrate base 110 may be a glass substrate. The material of the buffer layer 120 may be an inorganic dielectric material, for example, silicon nitride, silicon oxide, or silicon oxynitride, which is used to eliminate the stress of other subsequent film layers on the glass substrate. In some embodiments of the disclosure, the material of the buffer layer 120 may be silicon nitride.

With regarding to the hierarchical structure, the first metal wiring layer 130 may include a copper seed layer 131 and a copper growth layer 132 sequentially stacked on one side of the substrate base 110. In some embodiments, the copper growth layer 132 can be disposed on a surface of the copper seed layer 131 away from the substrate base, thereby exposing at least partial side surfaces of the copper seed layer 131. For example, the copper seed layer 131 and the copper growth layer 132 have their orthographic projections on the substrate base 110 roughly coincided with each other. In some other embodiments, as shown in FIG. 12, the copper growth layer 132 may completely cover the side surfaces of the copper seed layer 131 and the surface thereof away from the substrate base.

The copper seed layer 131 may be formed by a magnetron sputtering method, and the copper growth layer 132 may be formed by an electroplating or electroless plating method. Optionally, the copper seed layer 131 may include a first metal adhesion layer and a first copper metal layer sequentially stacked on one side of the substrate base 110. The first metal adhesion layer is used for reinforcing a bonding force between the first copper metal layer and the buffer layer 120, and the material of the first metal adhesion layer can be an alloy material containing molybdenum, for example, a molybdenum-niobium alloy, a molybdenum-niobium-copper alloy, and the like. Optionally, the first metal wiring layer 130 may further include a first metal protection layer located on the side of the copper growth layer 132 away from the substrate base 110. The first metal protection layer is used for preventing the surface of the copper growth layer 132 from being oxidized, and the he material of the metal protection layer may be an alloy containing nickel, for example, a copper-nickel alloy. According to some embodiments, in terms of patterns and functions, the first metal wiring layer 130 may include the driving leads 300 and the fan-out leads 440 of the array substrate. In some embodiments of the disclosure, the first metal wiring layer 130 may further include the bonding pads 430.

The material of the first passivation layer 141 and the second passivation layer 160 may be an inorganic dielectric material, such as silicon nitride, silicon oxide, or silicon oxynitride. In some embodiments of the disclosure, the material of the first passivation layer 141 and the second passivation layer 160 may be silicon nitride.

The material of the planarization organic material layer 142 may be an organic material, such as polyimide, epoxy resin, phenolic resin, or other organic materials. In some embodiment of the disclosure, the planarization organic material layer 142 may be an organic material containing a photosensitizer.

A via hole may be provided on the first passivation layer 141 and the planarization organic material layer 142 to expose at least part of the first metal wiring layer 130, so that the second metal wiring layer 150 can be connected to the first metal wiring layer 130 through the via hole. Exemplarily, part of the connecting leads 200 may be connected to the driving leads 300 through the via hole.

In some embodiments of the disclosure, the bonding pads 430 are located on the first metal wiring layer 130, and the first passivation layer 141 and the planarization organic material layer 142 may also expose at least part of bonding pads 430, thereby facilitating connection between the bonding pads 430 and the circuit board. In some other embodiments of the disclosure, the bonding pads 430 are located on the second metal wiring layer 150, and the first passivation layer 141 and the planarization organic material layer 142 may expose at least part of the fan-out leads 440, thereby enabling the bonding pads 430 to be connected to the fan-out leads 440 through the via hole.

The second metal wiring layer 150 may include a second metal adhesion layer and a second copper metal layer stacked in sequence. The second metal adhesion layer is used for enhancing the bonding between the second copper metal layer and the planarization organic material layer 142. The material of the second metal adhesion layer can be an alloy material containing molybdenum, for example, a molybdenum-niobium alloy, a molybdenum-niobium-copper alloy, and the like. Further, the second metal wiring layer 150 may also include a second metal protection layer located on one side of the second copper metal layer away from the substrate base 110, so as to prevent the surface of the second copper metal layer from being oxidized, and to improve the bonding force between the light emitting element 700, the microchip 600 and the second metal wiring layer 150. The material of the second metal protection layer may be an alloy containing nickel, for example, it may be a copper-nickel alloy or a copper-titanium alloy. In some embodiments, in terms of patterns and functions, the second metal wiring layer 150 may include the first pad group 410 and the second pad group 420 and the connecting leads 200 of the array substrate. In some embodiments of the disclosure, the second metal wiring layer 150 may further include the bonding pads 430; further, the surface of the bonding pads 430 may also be provided with a conductive metal oxide, such as indium tin oxide (ITO), so as to avoid oxidation of the surface of the bonding pads 430.

The material of the insulating protection layer 170 may include an organic insulating material, for example, may contain a resin material. Optionally, the insulating protection layer 170 may further include inorganic materials, for example, may include inorganic particles dispersed in resin. Exemplarily, the insulating protection layer 170 may be an organic-inorganic composite layer formed by cross-linking and curing acrylic monomers dispersed with nano titanium oxide particles. The insulating protection layer 170 and the second passivation layer 160 may have via holes exposing each sub-pad of the first pad group 410 and each sub-pad of the second pad group 420, so as to bind and connect the light emitting element 700 and microchip 600 on the array substrate.

Exemplarily, the array substrate may be prepared by the method shown in the following steps S110 to S160.

In step S110, a substrate base 110 is provided. The substrate base 110 may be a glass substrate.

In step S120, a buffer layer 120 is formed on one side of the substrate base 110. Optionally, the buffer layer 120 may be formed through a deposition process.

In step S130, a first metal wiring layer 130 is formed on one side of the buffer layer 120 away from the substrate base 110. The first metal wiring layer 130 can be prepared in a variety of different processes.

Exemplarily, in some embodiments of the disclosure, an unpatterned copper seed layer 131 covering the substrate base 110 may be formed first, and then copper electroplating is adopted to deposit copper to form an unpatterned copper growth layer 132 Finally, the patterned copper seed layer 131 and the unpatterned copper growth layer 132 are patterned to obtain the first metal wiring layer 130. Exemplarily, in some other embodiments of the disclosure, a patterned copper seed layer 131 may be formed first, then a pattern defining layer covering the substrate base 110 and exposing the copper seed layer 131 may be formed, and then copper electroplating may be used to form a patterned copper growth layer 132 on the patterned copper seed layer 131 to obtain the first metal wiring layer 130, and then the pattern defining layer is removed. Exemplarily, in some other embodiments of the disclosure, an unpatterned copper seed layer 131 covering the substrate base 110 may be formed first, then a pattern defining layer is formed on one side of the copper seed layer 131 away from the substrate base 110, so as to expose only the position where a copper growth layer 132 needs to be formed, and then a patterned copper growth layer 132 is formed on the unpatterned copper seed layer 131 through a copper electroplating process; and after removing the pattern defining layer, the unpatterned copper growth layer 131 is patterned to obtain the first metal wiring layer 130.

In step S140, a first passivation material layer and a planarization organic material layer 142 are sequentially formed on one side of the first metal wiring layer 130 away from the substrate base 110, and the planarization organic material layer 142 has via holes; then the first passivation material layer is etched by using the planarization organic material layer 142 as a mask, so that the via holes penetrate the first passivation material layer to expose a partial region of the first metal wiring layer 130. The first passivation material layer is patterned into a first passivation layer 141.

In step S150, a second metal wiring layer 150 is formed on the side of the planarization organic material layer 142 away from the substrate base 110.

In step S160, a second passivation material layer and an insulating protection layer 170 are sequentially formed on the side of the second metal wiring layer 150 away from the substrate base 110, and the insulating protection layer 170 has via holes. The second passivation material layer is etched by using the insulating protection layer 170 as a mask, so that the via holes penetrate the second passivation material layer to expose a partial region of the second metal wiring layer 150. The second passivation material layer is patterned into a second passivation layer 160.

It should be noted that although the steps of the method according to the disclosure are described above in a specific order as illustrated in the drawings, it does not require or imply that these steps must be performed in the specific order, or that all the steps shown must be performed to achieve the desired result. Additionally or alternatively, certain steps may be omitted, multiple steps may be combined into one step for execution, and/or one step may be decomposed into multiple steps for execution, all these variations should be regarded as part of the disclosure.

Optionally, a plurality of different array substrates can be combined with each other to form a spliced array substrate with a larger size. In particular, when the array substrate is bound with the microchip 600 and the light-emitting element 700 to form a light-emitting substrate, multiple light-emitting substrates can be combined with each other to form a large-size light-emitting substrate.

Exemplarily, in some embodiments of the disclosure, the array substrate may be an array substrate of 50 to 100 inches, for example, it may be an array substrate of 65 inches or 75 inches. Exemplarily, in some other embodiments of the disclosure, the array substrate may be an array substrate of 10 to 50 inches, and a plurality of array substrates may be combined into a spliced large-size array substrate, for example, a 65-inch or 75-inch array substrate may be formed.

The embodiments of the disclosure also provide a light-emitting substrate, which includes any of the array substrates described in the above-mentioned array substrate embodiments, and includes microchips that are bonded and connected to each of the first pad groups 410 in a one-to-one correspondence and light-emitting elements that are bonded and connected to each of the first pad groups 410 in a one-to-one correspondence. The light-emitting substrate may be a Micro LED light-emitting substrate, Mini LED light-emitting substrate or other types of light-emitting substrates. Since the light-emitting substrate has any one of the array substrates described in the above-mentioned array substrate embodiments, it has the same beneficial effects, which will not be repeated herein.

The embodiments of the disclosure also provide a display device, which includes any one of the light-emitting substrates described in the above-mentioned embodiments of the light-emitting substrate. The display device may include a television, a computer screen, a mobile phone screen, or other types of display devices. Since the display device has any one of the light-emitting substrates described in the above-mentioned embodiments of the light-emitting substrate, it has the same beneficial effects, which will not be repeated herein.

In some embodiments of the disclosure, the display device includes a direct-type backlight and a liquid crystal display panel, wherein the direct-type backlight includes the light-emitting substrate according to the disclosure.

It should be understood that the disclosure does not limit its application to the detailed structure and arrangement of components proposed in this specification. The disclosure can be implemented through other embodiments and executed in various ways. The aforementioned deformations and modifications fall within the scope of the disclosure. It should be understood that the disclosure disclosed and defined in this specification extends to all alternative combinations of two or more individual features mentioned or apparent in the disclosure and/or drawings. All these different combinations constitute multiple alternative aspects of the disclosure. The embodiments of disclosure only illustrate the best way for implementing the disclosure, thereby enabling those skilled in the art to utilize the disclosure.

What is claimed is:

1. An array substrate, comprising:
a signal channel region extending in a first direction and a plurality of driving leads extending in the first direction, wherein:
the driving leads comprise a first power voltage lead and a second power voltage lead;
the signal channel region comprises at least two control region columns extending in the first direction, and each of the control region columns comprises a plurality of control regions arranged along the first direction;
the control regions comprises a pad connection circuit and a first pad group used for bonding a microchip, and the first pad group is electrically connected to the first power voltage lead;
the pad connection circuit comprises a plurality of second pad groups connected through a connecting lead, a first end of the pad connection circuit is electrically connected to the first pad group, and a second end of the pad connection circuit is electrically connected to the second power voltage lead; and
in the signal channel region, each of first pad groups in the at least two control region columns is electrically connected to the first power voltage lead.

2. The array substrate according to claim 1, wherein;
the signal channel region comprises two control region columns; and
in the signal channel region, a number of the first power voltage lead is one, and a number of the second power voltage lead is two and the two second power voltage leads are respectively located at both sides of the first power voltage lead.

3. The array substrate according to claim 2, wherein a number of the signal channel region is at least two and in any two adjacent signal channel regions, two adjacent second power voltage leads are electrically connected to each other.

4. The array substrate according to claim 2, wherein the driving lead further comprises a microchip driving lead connected to the first pad group and used for driving the microchip, and in the signal channel region, the microchip driving lead is located between the first power voltage lead and the second power voltage lead.

5. The array substrate according to claim 4, wherein:
the first pad group comprises a first input signal sub-pad used for loading a first input signal, a first power voltage sub-pad used for loading a first power voltage, and an output sub-pad used for loading an output signal;
in the signal channel region, the microchip driving lead comprises a first input signal lead located between the first power voltage lead and the second power voltage lead;

the first input signal sub-pad is connected to the first input signal lead directly or through the connecting lead;

the first power voltage sub-pad is connected to the first power voltage lead directly or through the connecting lead; and in each of the control regions, the pad connection circuit and the output sub-pad are arranged in a one-to-one correspondence, and the first end of the pad connection circuit is connected to a corresponding one of the output sub-pad through the connecting lead.

6. The array substrate according to claim 5, wherein in the signal channel region, a number of the first input signal lead is two, and the two of first input signal leads are respectively located at both sides of the first power voltage lead.

7. The array substrate according to claim 6, wherein:
the second direction is parallel to a plane of the array substrate and perpendicular to the first direction;
in the signal channel region, along the second direction, first one of the control region columns corresponds to first one of the second power voltage leads and first one of the first input signal leads, and second one of the control region columns corresponds to second one of the second power voltage leads and second one of the first input signal leads; and
the second end of each of the pad connection circuits in the control region column is electrically connected to a corresponding one of the second power voltage leads through the connecting lead, and each of the first input signal sub-pads in the control region column is connected to a corresponding one of the first input signal leads through the connecting lead.

8. The array substrate according to claim 6, wherein, in the signal channel region, the microchip driving lead further comprises a second input signal lead, the first pad group further comprises a second input signal sub-pad; and the second input signal lead is used for loading a second input signal to the second input signal sub-pad.

9. The array substrate according to claim 8, wherein, in the signal channel region, P of the first pad groups are sequentially numbered according to a preset order; wherein, the second input signal sub-pad in the first pad group numbered 1 is connected to the second input signal lead through the connecting lead, and the output sub-pad in the first pad group numbered p is electrically connected to the second input signal sub-pad in the first pad group numbered p+1 through the connecting lead, wherein p and P are integers, and p is valued greater than 1 and less than P.

10. The array substrate according to claim 8, wherein, in the signal channel region, the second input signal lead is located between the first input signal lead and the second power voltage lead.

11. The array substrate according to claim 10, further comprising a bonding region, and the bonding region is provided with bonding pads respectively connected to each of the driving leads; the first pad group farthest from the bonding region or closest to the bonding region in the signal channel region is the first pad group numbered 1 in the signal channel region.

12. The array substrate according to claim 11, wherein the bonding region is provided with a floating bonding pad, and the floating bonding pad is connected to the output sub-pad of the first pad group numbered P in the signal channel region.

13. The array substrate according to claim 11, wherein:
the second direction is parallel to a plane of the array substrate and perpendicular to the first direction;
in the signal channel region, along the second direction, the second input signal lead is located between first one of the second power voltage leads and second one of the first input signal leads; and
a distance between the first one of the second power voltage leads and the second one of the first input signal leads is equal to a distance between second one of the second power voltage leads and the second one of the first input signal leads.

14. The array substrate according to claim 1, further comprising a bonding region, and the bonding region is provided with a bonding pad group corresponding to the signal channel region one by one; wherein the bonding pad group comprises a plurality of bonding pads connected in a one-to-one correspondence with the plurality of driving leads in the corresponding signal channel region.

15. The array substrate according to claim 14, wherein the plurality of driving leads in the signal channel region are arranged in an order along a direction perpendicular to the first direction, and the plurality of bonding pads connected to the plurality of driving leads, respectively, are arranged in the same order along the same direction.

16. The array substrate according to claim 14, wherein:
the bonding pad group comprises a second power voltage bonding pad for connecting with the second power voltage lead; and
two of the second power voltage bonding pad connected respectively by two adjacent ones of the second power voltage lead in two adjacent signal channel regions are connected to each other as a whole.

17. The array substrate according to claim 1, wherein the second pad group consists of a first sub-pad and a second sub-pad, the pad connection circuits comprises a plurality of the second pad groups connected in sequence, wherein the first sub-pad in first one of the second pad groups is electrically connected to the second power voltage lead through the connecting lead, and the second sub-pad in last one of the second pad groups is electrically connected to the first pad group through the connecting lead, and the second sub-pad in a previous one of the second pad groups is connected to the first sub-pad in a latter one of the second pad groups through the connecting lead.

18. The array substrate according to claim 14, wherein the array substrate comprises a substrate base, a first metal wiring layer, an insulating material layer, and a second metal wiring layer that are sequentially stacked, wherein the driving leads and the bonding pad group are located on the first metal wiring layer, the connecting lead, the first pad group, and the second pad group are located on the second metal wiring layer; the second metal wiring layer is electrically connected to the first metal wiring layer through a via hole located in the insulating material layer.

19. A light-emitting substrate, comprising:
the array substrate according to claim 1, and
microchips bonded to each of the first pad group in a one-to-one correspondence and light-emitting elements bonded to each of the first pad group in a one-to-one correspondence.

20. A display device comprising the light-emitting substrate according to claim 19.

* * * * *